United States Patent [19]

Mikoshiba et al.

[11] Patent Number: 5,179,042

[45] Date of Patent: Jan. 12, 1993

[54] PROCESS FOR FORMING DEPOSITED FILM BY USE OF ALKYL ALUMINUM HYDRIDE

[75] Inventors: Nobuo Mikoshiba; Kazuo Tsubouchi; Kazuya Masu, all of Sendai, Japan

[73] Assignee: Canon Kabushiki Kaisha, Tokyo, Japan

[21] Appl. No.: 578,672

[22] Filed: Sep. 7, 1990

[30] Foreign Application Priority Data

| Sep. 9, 1989 | [JP] | Japan | 1-233924 |
| Sep. 9, 1989 | [JP] | Japan | 1-233926 |
| Jan. 16, 1990 | [JP] | Japan | 2-6557 |
| Jan. 16, 1990 | [JP] | Japan | 2-6558 |

[51] Int. Cl.$^5$ ............................. H01L 21/285
[52] U.S. Cl. ................... 437/187; 437/192; 437/195; 437/203; 437/245
[58] Field of Search .......... 437/89, 187, 192, 195, 437/203; 148/33, 33.1, DIG. 93, DIG. 158, DIG. 169

[56] References Cited

FOREIGN PATENT DOCUMENTS

| 2053242 | 6/1971 | Fed. Rep. of Germany . |
| 63-33569 | 2/1988 | Japan . |
| 1-252776 | 10/1989 | Japan . |
| 2-170419 | 7/1990 | Japan . |
| 2-185026 | 7/1990 | Japan . |

OTHER PUBLICATIONS

R. A. Levy et al., "Characterization of LPCVD Aluminum for VLSI Processing", Journal of the Electrochemical Society, vol. 131, No. 9, pp. 2175-2182, Sep. 1984.

R. Bhat et al., "The Growth and Characterization of AlGaAs Using Dimethyl Aluminum Hydride", Journal of Crystal Growth, vol. 77, pp. 7-10 (1986).

M. Hanabusa et al., "Photochemical Vapor Deposition of Aluminum Thin Films Using Dimethylaluminum Hydride", Japanese Journal of Applied Physics, vol. 27, No. 8, pp. L1392-L1394, Aug. 1988.

A. Sekiguchi et al., "Gas-Temperature-Controlled (GTC) CVD of Aluminum and Aluminum-Silicon Alloy Film for VLSI Processing", Japanese Journal of Applied Physics, vol. 27, No. 11, pp. L2134-L2136, Nov. 1988.

H. O. Pierson, "Aluminum Coatings By the Decomposition of Alkyls", Thin Solid Films, vol. 45, pp. 257-263, 1977.

T. Cacouris et al., "Laser direct writing of aluminum conductors", Applied Physics Letters, vol. 52, No. 22, pp. 1865-1867, May 30, 1988.

C. Sasaoka et al., "Aluminum selective area deposition on Si using dimethylaluminumchloride", Applied Physics Letters, vol. 55, No. 8, pp. 741-743, Aug. 21, 1989.

Primary Examiner—Olik Chaudhuri
Assistant Examiner—Ourmazd S. Ojan
Attorney, Agent, or Firm—Fitzpatrick, Cella, Harper & Scinto

[57] ABSTRACT

A process for forming an Al film of good quality according to the CVD method utilizing the reaction between alkyl aluminum hydride and hydrogen, which is an excellent deposited film formation process also capable of selective deposition of Al.

21 Claims, 10 Drawing Sheets

PROCESS FOR FORMING DEPOSITED FILM BY USE OF ALKYL ALUMINUM HYDRIDE

BACKGROUND OF THE INVENTION

1. Field of the Invention

This invention relates to a process for forming a deposited film, particularly a process for forming an Al deposited film which can be preferably applied to electrodes or wiring of a semiconductor integrated circuit device, etc.

2. Related Background Art

In the prior art, in electronic devices or integrated circuits by use of semiconductors, for electrodes and wiring, aluminum (Al) has been primarily used. Al has many advantages such that it is inexpensive and high in electroconductivity, that it can be also internally chemically protected because a dense oxidized film can be formed on the surface, and that it has good adhesion to Si, etc.

As the method for forming Al film for electrodes and wiring of Al or Al alloy as mentioned above, there has been used in the prior art the sputtering method such as magnetron sputtering, etc. However, since the sputtering is generally the physical deposition method based on flying of sputtered particles in vacuum, the film thickness at the stepped portion or the insulating film side wall becomes extremely thin, leading to wire breaking in an extreme case. Nonuniformity of film thickness or wire breaking has the drawback that reliability of LSI is markedly lowered.

On the other hand, since the integration degree of the integrated circuit such as LSI, etc. is increased, and fine formation of wiring or multi-layer wiring has been particularly required in recent years, there is an increasing severe demand not found up to date for Al wiring of the prior art. With finer dimensional formation by increased integration degree, the surface of LSI, etc. is subject to excessive unevenness due to oxidation, diffusion, thin film deposition, and etching, etc. For example, electrodes or wiring metal must be deposited on the surface with a stepped difference, or deposited in a via-hole which is fine in diameter and deep. In 4 Mbit or 16 Mbit DRAM (dynamic RAM), etc., the aspect ratio (via-hole depth/via-hole diameter) or via-hole in which a metal composed mainly of Al such as Al, Al-Si, etc. is to be deposited is 1.0 or more, and the via-hole diameter itself also becomes 1 $\mu$m or less. Therefore, even for a via-hole with large aspect ratio, the technique which can deposit a metal is required.

Particularly, for performing sure electrical connection to the device under insulating film such as $SiO_2$, etc., rather than film formation, Al is required to be deposited so as to embed only the via-hole of the device. In such case, a method of depositing Al only on Si or metal surface and not depositing it on an insulating film such as $SiO_2$, etc. is required.

Such selective deposition or selective growth cannot be realized by the sputtering method which has been used in the prior art. Since the sputtering method is a physical deposition method based on flying of the particles sputtered from the target in vacuum, the film thickness at the stepped portion or the insulating film side wall becomes extremely thin, leading even to wire breaking in an extreme case. And, nonuniformity of the film thickness and wire breaking will markedly lower reliability of LSI.

As the improved sputtering method, there has been developed the bias sputtering method in which a bias is applied on a substrate and deposition is performed so as to embed Al or an Al alloy only in the via-hole by utilizing the sputter etching action and the deposition action on the substrate surface. However, since the bias voltage of some 100 V or higher is applied on the substrate, deleterious influence on the device occurs because of charged particle damaging such as change in threshold of MOS-FET, etc. Also, because of presence of both etching action and deposition action, there is the problem that the deposition speed cannot be essentially improved.

In order to solve the problems as described above, various types of CVD (Chemical Vapor Deposition) methods have been proposed. In these methods, chemical reaction of the starting gas in some form is utilized. In plasma CVD or optical CVD, decomposition of the starting gas occurs in gas phase, and the active species formed there further reacts on the substrate to give rise to film formation. In these CVD methods, due to the reaction in gas phase, surface coverage on unevenness on the substrate surface is good. However, carbon atoms contained in the starting gas molecule are incorporated into the film. Also, particularly in plasma CVD, the problem remained that there was damage by charged particles (so called plasma damage) as in the case of the sputtering method.

The thermal CVD method, in which the film grows through the surface reaction primarily on the substrate surface, is good in surface coverage on unevenness such as stepped portion of the surface, etc. Also, it can be expected that deposition within via-hole will readily occur. Further, wire breaking at the stepped portion can be avoided.

For such reasons, as the formation method of Al film, the thermal CVD method has been variously studied. As the formation method of Al film according to general thermal CVD, there is used a method of transporting and organic aluminum dispersed in carrier gas to a heated substrate and pyrolyzing the gas molecules on the substrate to form a film. For example, in an example seen in Journal of Electrochemical Society, Vol. 131, p. 2175 (1984), by use of triisobutyl aluminum (i—$C_4H_9$)$_3$Al (TIBA) as organic aluminum gas, film formation is effected at a film formation temperature of 260° C. and a reaction tube pressure of 0.5 torr to form a film of 3.4 $\mu$ohm.cm.

Japanese Laid-open Patent Application No. 63-33569 describes a method of forming a film by using no $TiCl_4$, but using in place thereof organic aluminum such as TIBA and heating it in the vicinity of the substrate. According to this method, Al can be deposited selectively only on the metal or semiconductor surface from which the naturally oxidized film has been removed.

In this case, it is clearly stated that the step of removing the naturally oxidized film on the substrate surface is necessary before introduction of TIBA. Also, it is described that, since TIBA can be used alone, no carrier gas is required to be used, but Ar gas may be also used as the carrier gas. However, the reaction of TIBA with another gas (e.g. $H_2$) is not contemplated at all, and there is no description of use of $H_2$ as the carrier gas. Also, in addition to TIBA, trimethyl aluminum (TMA) and triethyl aluminum (TEA) are mentioned, but there is no specific description of other organic metals. This is because, since the chemical properties of organic metals generally vary greatly if the organic substituent attached to the metal element varies little, it is necessary to investigate individually by detailed experimentation to determine what organic metal should be used.

In the CVD method as described above, not only there is an inconvenience that the naturally oxidized film must be removed, but also there is the drawback that no surface smoothness can be obtained. Also, there is the restriction that heating of the gas is necessary, and yet heating must be done in the vicinity of the substrate. Besides, it must also be experimentally determined at what proximity to the substrate heating must be done, whereby there is also the problem that the place for setting the heater cannot be necessarily freely chosen.

In the pre-text of the 2nd Symposium of Electrochemical Society, Branch of Japan (Jul. 7, 1989), on page 75, there is a description of film formation of Al according to the double wall CVD method. In this method, TIBA is used and the device is designed so that the gas temperature of TBA can be made higher than the substrate temperature. This method may be also regarded as a modification of the above-mentioned Japanese Laid-open Patent Application No. 63-33569. Also in this method, Al can be selectively grown only on a metal or semiconductor, but not only the difference between the gas temperature and the substrate surface temperature can be controlled with difficulty, but also there is the drawback that the bomb and the pipeline must be heated. Moreover, according to this method, there are involved such problems that no uniform continuous film can be formed, that flatness of the film is poor, that selectivity of Al selective growth cannot be maintained for so long time, etc., unless the film is made thick to some extent.

As described above, prior art methods cannot necessarily effect well selective growth of Al, and even if possible, there is a problem with respect to flatness, resistance, purity, etc. of the Al film formed. Also, there has been involved the problem that the film formation method is complicated and can be controlled with difficulty.

SUMMARY OF THE INVENTION

As described above, in the technical field of semiconductors in which higher integration has been desired in recent years, for providing inexpensively a semiconductor device which is more highly integrated and also made higher in performances, there remained ample room for improvement.

The present invention has been accomplished in view of the technical tasks as described above, and an object of the present invention is to provide a process for forming a deposited film which can form an Al film (hereinafter referring comprehensively to pure Al and a metal composed mainly of Al) of good quality as the electroconductive material at a desired position with good controllability.

Another object of the present invention is to provide a process for forming a deposited film which can obtain an Al film which has extremely broad general purpose utility and yet is of good quality, without requiring particularly no complicated and expensive deposited film forming device.

Still another object of the present invention is to provide a process for forming a deposited film which can form an Al film excellent in surface characteristic, electrical characteristics, purity, etc. according to the CVD method utilizing alkyl aluminum hydride and hydrogen.

Still another object of the present invention is to provide a process for forming a deposited film of an Al film which is extremely broad in general purpose utility and excellent in selectivity, without requiring particularly a complicated and expensive deposited film forming device.

Still another object of the present invention is to provide a process for forming a deposited film which can form an Al film under good selectivity according to the CVD method utilizing alkyl aluminum hydride and hydrogen.

DETAILED DESCRIPTION OF THE PREFERRED EMBODIMENTS

Figure 1:
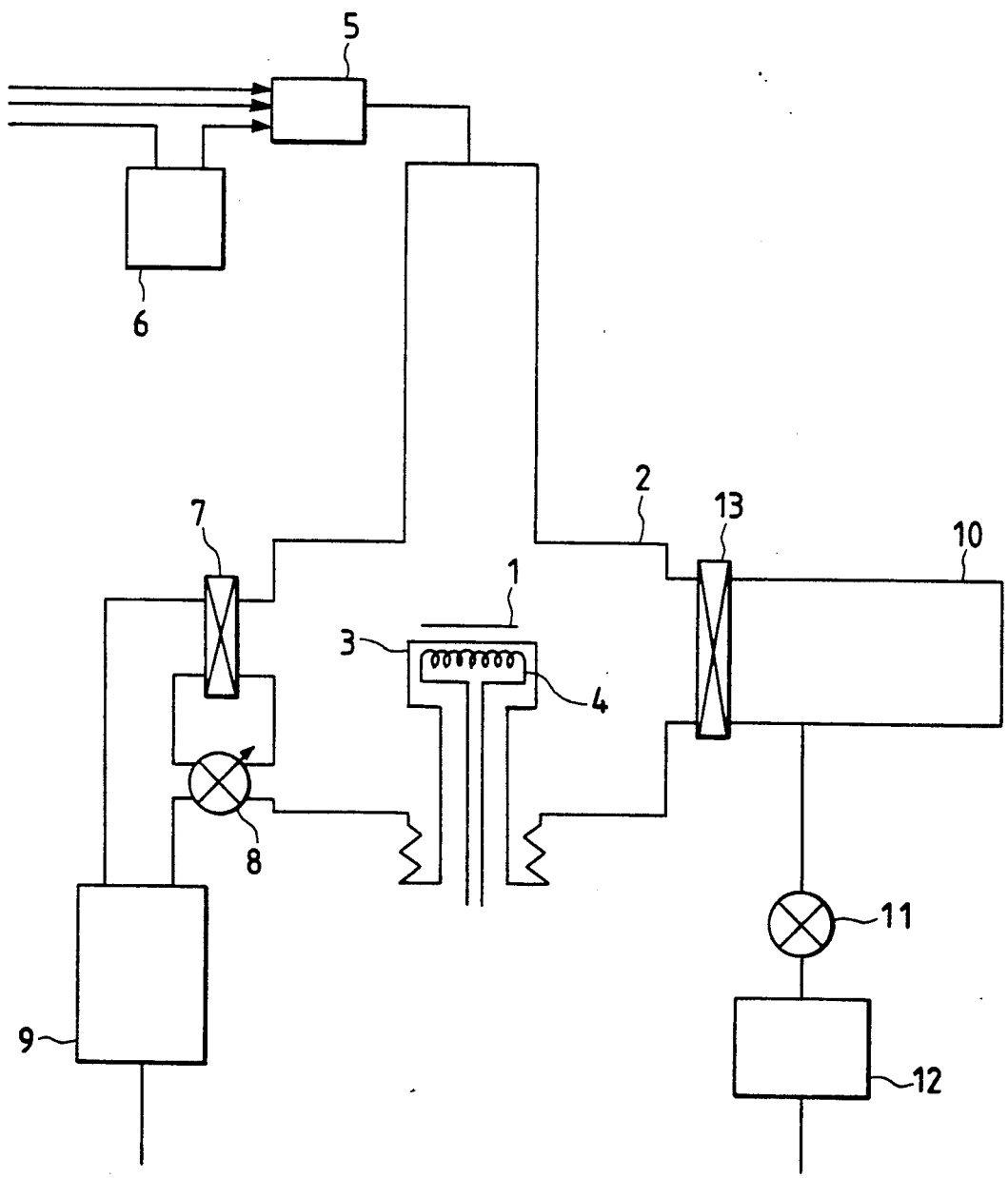
FIG. 1 is a schematic view for illustration of a suitable deposited film forming device in practicing the deposited film forming process according to the process of the present invention.

Preferred embodiments according to the present invention are described in detail below, but the present invention is not limited by these embodiments, and it may have a constitution which accomplishes the object of the present invention.

One preferred embodiment of the present invention is a process for forming a deposited film comprising the steps of:
(a) providing a substrate having an electron donative surface (A) in a space for formation of the deposited film;
(b) introducing a gas of an alkyl aluminum hydride and hydrogen gas into the space for formation of the deposited film; and
(c) maintaining the temperature of the electron donative surface (A) within the range of from the decomposition temperature of the alkyl aluminum hydride to 450° C. to form an aluminum film on the electron donative surface (A).

Further, another preferred embodiment of the present invention is a process for forming a deposited film comprising the steps of:
(a) providing a substrate having an electron donative surface (A) and a electron non-donative surface (B) in a space for formation of the deposited film;
(b) introducing a gas of an alkyl aluminum hydride and hydrogen gas into the space for formation of the deposited film; and
(c) maintaining the temperature of the electron donative surface (A) within the range of from the decomposition temperature of the alkyl aluminum hydride to 450° C. to form an aluminum film selectively on the electron donative surface (A).

In the following, prior to detailed description, first, the process for forming a deposited film by use of an organic metal is outlined.

The decomposition reaction of an organic metal, and hence the thin film deposition reaction will vary greatly depending on the kind of the metal atom, the kind of the alkyl bonded to the metal atom, the means of causing the decomposition reaction to occur, the atmospheric gas, etc.

For example, in the case of M—R$_3$ (M: the group III metal, R: alkyl group), trimethyl gallium:

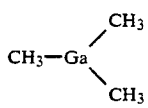

in thermal decomposition undergoes radical cleavage wherein Ga—CH$_3$ bond is cleaved, while triethyl gallium:

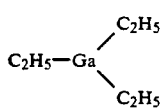

in thermal decomposition is decomposed through $\beta$-elimination into:

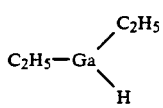

and C$_2$H$_4$. On the other hand, triethyl aluminum attached with the same ethyl group:

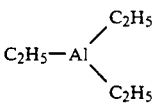

in thermal decomposition undergoes radical decomposition in which Al—C$_2$H$_5$ is cleaved. However, tri-isobutyl aluminum having iC$_4$H$_9$ bonded therein:

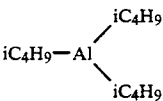

is subject to $\beta$-elimination.

Trimethyl aluminum (TMA) comprising CH$_3$ groups and Al has a dimer structure at room temperature:

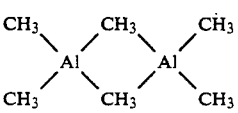

and thermal decomposition is radical decomposition in which Al—CH$_3$ group is cleaved, and at a temperature of 150° C. or lower, it reacts with atmospheric H$_2$ to form CH$_4$, and forms finally Al.

However, at a high temperature of 300° C. or higher, even if H$_2$ may be present in the atmosphere, CH$_3$ group will withdraw H from the TMA molecule, until finally Al-C compound is formed.

Also, in the case of TMA, in light or a certain region controlled in electric power in H$_2$ atmosphere high frequency (ca. 13.56 MHz) plasma, C$_2$H$_6$ will be formed by the bridging CH$_3$ between two Al's.

In essence, since even an organic metal comprising CH$_3$ group which the simplest alkyl group, C$_2$H$_5$ group or iC$_4$H$_9$ group and Al or Ga has a reaction mode depending on the kind of the alkyl group, the kind of the metal atom, the excitation decomposition means, for deposition of a metal atom from an organic metal on a desired substrate, the decomposition reaction must be strictly controlled. For example, when Al is to be deposited from triisobutyl aluminum:

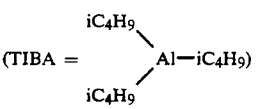

in the low pressure CVD method comprising mainly thermal reaction, unevenness on the $\mu$m order is formed on the surface, whereby the surface morphology is inferior. Also, hillock generation by heat treatment, Si surface roughening through Si diffusion at the interface between Al and Si occur, and also migration resistance is inferior, whereby it can be utilized for ultra-LSI process with difficulty.

For this reason, a method for controlling precisely both the gas temperature and the substrate temperature has been attempted. However, the device is complicated, and the method is of the sheet treatment type in which deposition can be effected only on one wafer by one deposition process. Besides, since the deposition speed is 500 A/min. at the highest, the throughput necessary for bulk production cannot be realized.

Similarly, when TMA is employed, Al deposition has been attempted by use of plasma or light, the device also becomes complicated due to use of plasma or light, and also because of the sheet type device, there remains room for improvement for sufficient improvement of throughput.

Dimethyl aluminum hydride (DMAH) as the alkyl aluminum hydride to be utilized in the present invention is a substance known as alkyl metal, but it could not be estimated at all what Al thin film could be deposited depending on what reaction mode, unless deposited films are formed under all the conditions. For example, in an example of deposition Al by optical CVD from DMAH, the surface morphology is inferior, and the resistivity value was greater than the bulk value (2.7 μohm.cm) as several μohm to 10 μohm.cm, thus being inferior in film quality.

Now, referring to the drawings, preferred embodiments of the present invention are described in more detail.

In the present invention, for depositing selectively an Al film of good quality as the electroconductive deposition film on a substrate, the CVD method is used.

More specifically, by use of dimethyl aluminum hydride (DMAH):

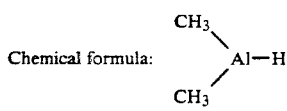

as alkyl aluminum hydride which is an organic metal or monomethyl aluminum hydride (MMAH$_2$):

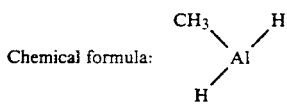

as alkyl aluminum hydride as the starting gas containing at least one atom which becomes the constituent of the deposited film, and H$_2$ as the reaction gas, an Al film is formed by gas phase growth with a gas mixture of these on a substrate.

As the substrate applicable in the present invention, a material having an electron donative surface may be employed.

The electron donative material is described in detail below.

The electron donative material refers to one having free electrons existing or free electrons intentionally formed in the substrate, for example, a material having a surface on which the chemical reaction is promoted through give-and-take of electrons with the starting gas molecules attached on the substrate surface. For example, generally metals and semiconductors correspond to such material. Those having very thin oxidized film on the metal or semiconductor surface are also included. For, with such thin film, the chemical reaction can occur between the substrate and the attached starting molecules.

Specifically, there may be included semiconductors such as monocrystalline silicon, polycrystalline silicon, amorphous silicon, etc., binary system or ternary system or quaternary system III–V compound semiconductors comprising combinations of Ga, In, Al as the group III element and P, As, N as the group V element, or II–IV compound semiconducters, or metals themselves such as tungsten, molybdenum, tantalum, aluminum, titanium, copper, etc., or silicides of the above metals such as tungsten silicide, molybdenum silicide, tantalum silicide, aluminum silicide, titanium silicide, etc., further metals containing either one of the constituent of the above metals such as aluminum silicon, aluminum titanium, aluminum copper, aluminum tantalum, aluminum silicon copper, aluminum silicon titanium, aluminum palladium, titanium nitride, etc.

On the substrate with such constitution, Al is deposited only through simple thermal reaction in the reaction system of the starting gas and H$_2$. For example, the thermal reaction in the reaction system between DMAH and H$_2$ may be basically considered as follows:

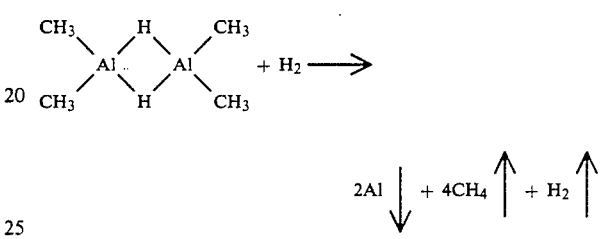

DMAH assumes a dimer structure at room temperature. Also, with MMAH$_2$, a high quality Al film could be formed by thermal reaction as shown below in Examples.

Since MMAH$_2$ has low vapor pressure as 0.01 to 0.1 Torr at room temperature, a large amount of the starting material can be transported with difficulty, and the upper limit value of the deposition speed is several hundred Å/min. in the present embodiment, and preferably, it is most desirable to use DMAH of which vapor pressure is 1 Torr at room temperature.

In another embodiment of the present invention, the CVD method is used for selective deposition of a good Al film as the electroconductive deposition film on the substrate.

More specifically, as described above, by use of dimethyl aluminum hydride (DMAH) or monomethyl aluminum hydride (MMAH$_2$) and H$_2$ as the reaction gas, an Al film is selectively formed on the substrate by gas phase growth with a gas mixture of these.

The substrate applicable in the present invention has a first substrate surface material for formation of the surface on which Al is deposited, and a second substrate surface material on which no Al is deposited. And, as the first substrate surface material, a material having the electron donative surface is used.

In contrast, as the material for forming the surface on which Al is not deposited selectively, namely the material for forming the electron non-donative surface, conventional insulating materials, oxidized silicon formed by thermal oxidation, CVD, etc., glass or oxidized film such as BSG, PSG, BPSG, etc., thermally nitrided film, silicon nitrided film by plasma CVD, low pressure CVD, ECR-CVD method, etc.

FIG. 1 is a schematic view showing a preferable deposition film forming device for applying the present invention.

Here, 1 is a substrate for forming an Al film. The substrate 1 is mounted on a substrate holder 3 provided internally of the reaction tube 2 for forming a space for formation of a deposited film which is substantially closed to FIG. 1. As the material constituting the reaction tube 2, quartz is preferable, but it may be also made of a metal. In this case, it is preferable to cool the reaction tube. The substrate holder 3 is made of a metal, and is provided with a heater 4 so that the substrate mounted thereon can be heated. And, the constitution is made so that the substrate temperature can be controlled by controlling the heat generation temperature of the heater 4.

The feeding system of gases is constituted as described below.

5 is a gas mixer, in which the starting gas and the reaction gas are mixed, and the mixture is fed into the reaction tube 2. 6 is a starting gas gasifier provided for gasification of an organic metal as the starting gas.

The organic metal to be used in the present invention is liquid at room temperature, and is formed into saturated vapor by passing a carrier gas through the liquid of the organic metal within the gasifier 6, which is in turn introduced into the mixer 5.

The evacuation is constituted as described below.

7 is a gate valve, which is opened when performing evacuation of a large volume such as during evacuation internally of the reaction tube 2 before formation of the deposited film. 8 is a slow leak valve, which is used when performing evacuation of a small volume such as in controlling the pressure internally of the reaction tube 2 during formation of the deposited film. 9 is an evacuation unit, which is constituted of a pump for evacuation such as turbo molecular pump, etc.

The conveying system of the substrate 1 is constituted as described below.

10 is a substrate conveying chamber which can house the substrate before and after formation of the deposited film, which is evacuated by opening the valve 11. 12 is an evacuation unit for evacuating the conveying chamber, which is constituted of a pump for evacuation such as turbo molecular pump, etc.

The valve 13 is open only when the substrate 1 is transferred between the reaction chamber and the conveying space.

As shown in FIG. 1, in the starting gas gasifier 6 which is the gas formation chamber for forming the starting gas, the liquid DMAH maintained at room temperature is bubbled with $H_2$ or Ar (or other inert gas) as the carrier gas to form gaseous DMAH, which is transported to the mixer 5. The $H_2$ gas as the reaction gas is transported through another route into the mixer 5. The gases are controlled in flow rates so that the respective partial pressures may become desired values.

In the case of forming a film by this device, the starting gas may be of course $MMAH_2$, but DMAH with a vapor pressure enough to become 1 Torr at room temperature is the most preferred. Also, DMAH and $MMAH_2$ may be used in a mixture.

The deposited film formed at a substrate temperature of 160° C. to 450° C. by use of such starting gas and reaction gas, with a thickness of for example 400 Å, has a resistivity at room temperature of 2.7–3.0 μohm.cm which is substantially equal to Al bulk resistivity, and is a continuous and flat film. At this time, the pressure during film formation can be chosen within the range from $10^{-3}$ Torr to 760 Torr. Also, even when the film thickness may be 1 μm, its resistivity is ca. 2.7–3.0 μohm.cm, and a sufficiently dense film can be formed also with a relatively thicker film. Also, the reflectance in the visible light wavelength region is approximately 80%, whereby a thin film excellent in surface flatness can be deposited.

The substrate temperature is desirably the decomposition temperature of the starting gas containing Al or higher, and 450° C. or lower as described above, but specifically the substrate temperature of 200° to 450° C. is more desirable, and when deposition is carried out under this condition, by making the DMAH partial pressure $10^{-4}$ to $10^{-3}$ Torr, the deposition speed becomes very great as 100 Å/min. to 800 Å/min., whereby sufficient great deposition speed corresponding to the cost as the Al deposition technique for ultra-LSI can be obtained.

A more preferable substrate temperature condition is 270° C. to 350° C., and the Al film deposited under this condition is also strongly orientatable and, even when subjected to the heat treatment at 450° C. for 1 hour, the Al film on the Si monocrystalline or Si polycrystalline substrate becomes a good Al film without generation of hillock, spike as seen in the film forming method of the prior art. Also, such Al film is excellent in electromigration resistance.

In the device shown in FIG. 1, Al can be deposited on only one sheet of substrate in deposition for one time. Although a deposition speed of ca. 800 Å/min. can be obtained, it is still insufficient for performing deposition of a large number of sheets within a short time.

As the deposition film forming device for improving this point, there is the low pressure CVD device which can deposit Al by simultaneous mounting of a large number of sheets of wafer. Since the Al film formation according to the present embodiment utilizes the surface reaction on the electron donative substrate surface, in the hot wall type low pressure CVD method wherein only the substrate is heated, Al can be deposited on the substrate by use of DMAH and $H_2$.

The reaction tube pressure may be 0.05 to 760 Torr, desirably 0.1 to 0.8 Torr, the substrate temperature 160° C. to 450° C., desirably 200° C. to 400° C., the DMAH partial pressure $1 \times 10^{-5}$-fold to $1.3 \times 10^{-3}$-fold of the pressure in the reaction tube, and under such conditions, Al can be well deposited on the electron donative substrate.

Figure 2:
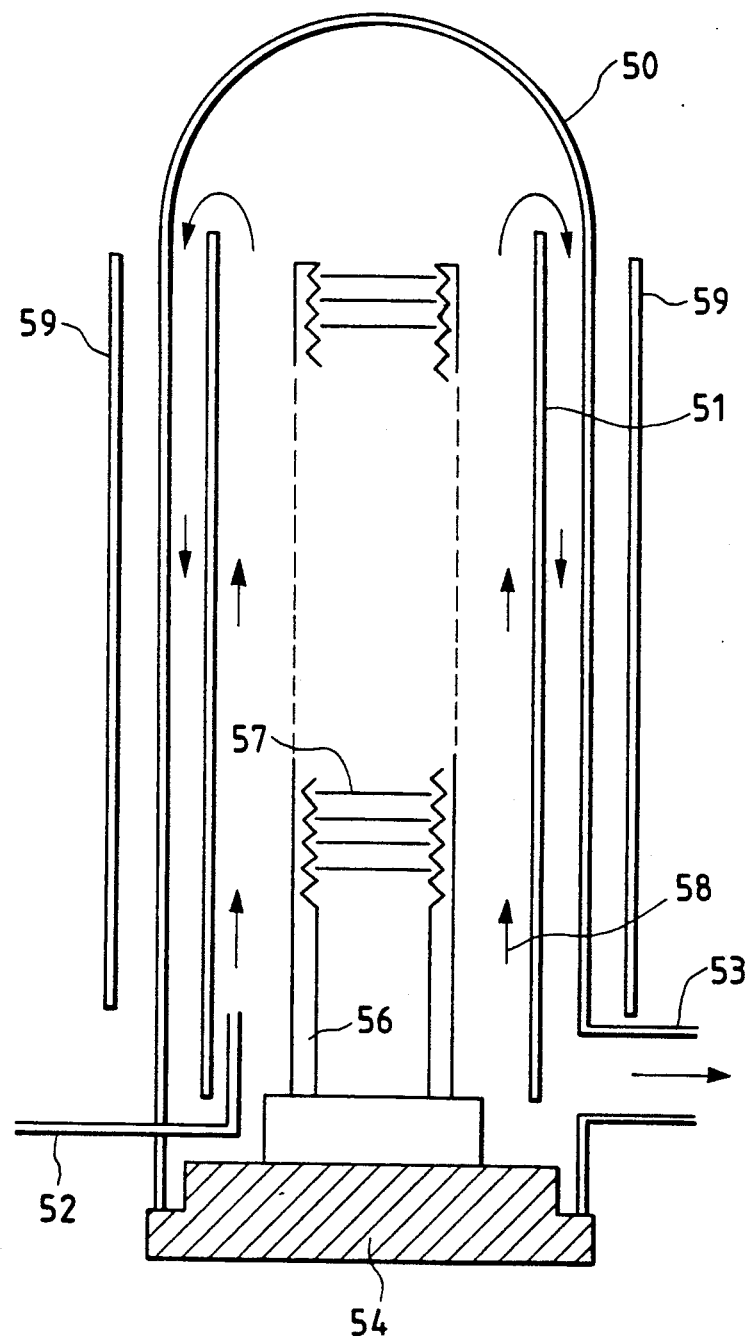
FIG. 2 is a schematic view for illustration of another suitable deposited film forming device in practicing the deposited film forming process according to the present invention.

FIG. 2 is a schematic illustration showing a deposited film forming device to which such present invention is applicable.

57 is a substrate for formation of Al film. 50 is an outside reaction tube made of quartz for forming a space for formation of deposited film substantially closed to the surrounding, 51 an innerside reaction tube made of quartz located for separating the flow of gas within the outside reaction tube 50, 54 a flange made of a metal for opening and closing of the opening of the outside reaction tube 50, and the substrate 57 is located within the substrate holding member 56 provided internally of the innerside reaction tube 51. The substrate holding member 56 should be preferably made of quartz.

Also, in the present device, the substrate temperature can be controlled by the heater portion 59. The pressure internally of the reaction tube 50 is constituted so as to be controllable by the evacuation system connected through the gas evacuation outlet 53.

The gas feeding system is constituted to have a first gas system, a second gas system and a mixer (none are shown) similarly as the device shown by the symbols 5 and 6 in FIG. 1, and the starting gas and the reaction gas are introduced into the reaction tube 50 through the starting gas inlet 52. These gases react on the surface of the substrate 57 during passage internally of the innerside reaction tube 51 as shown by the arrowhead 58 in FIG. 2 to deposit Al on the substrate surface. The gases after the reaction pass through the gap formed between the innerside reaction tube 51 and the outside reaction tube 50, and evacuated through the gas evacuation outlet 53.

In taking out and in the substrate, the flange 54 made of a metal is permitted to fall by an elevator (not shown) together with the substrate holding member 56 and the substrate 57 to be moved to a predetermined position where the substrate is mounted and detached.

By forming a deposited film under the conditions as described above by use of such device, Al films of good quality can be formed in all the wafers within the device.

As described above, the film obtained according to the Al film formation process based on the embodiment of the present invention is dense with little content of impurity such as carbon, etc. and resistivity which is similar to bulk, and also has high surface smoothness, and therefore remarkable effects as described below can be obtained.

(1) Reduction of hillock

Hillock is occurrence of concavities on the Al surface due to partial migration of Al when inner stress during film formation is released in the heat treatment step. Also, similar phenomenon occurs by local migration by current passage. The Al film formed by the present invention has little inner stress and is under the state of monocrystal or approximate to that. For this reason, in the heat treatment at 450° C. for one hour, as contrasted to formation of $10^4$–$10^6$/cm² of hillocks in the Al film of the prior art, the hillock number could be greatly improved as 0 to 10/cm². Thus, due to substantial absence of Al surface concavity, the resist film thickness and the interlayer insulating film can be made thin to be advantageous for making it finer and more flat.

(2) Improvement of electro-migration resistance

Electro-migration is the phenomenon that the wiring atoms move by passage of a current of high density. By this phenomenon, voids are generated and grown along the grain boundary, whereby as accompanied with reduction of the cross-sectional area, the wiring generates heat to be broken.

Migration resistance is generally evaluated by average wiring life.

The wiring formed by the sputtering method or the CVD method of the prior art has obtained an average wiring life of $1 \times 10^2$ to $10^3$ hours (in the case of a wiring cross-sectional area of 1 μm²) under the current passage test conditions of 250° C., $1 \times 10^6$ A/cm². In contrast, the Al film obtained by the Al film formation method based on the embodiment of the present invention could obtain an average wiring life of $10^3$ to $10^4$ hours with a wiring having a cross-sectional area of 1 μm².

Hence, according to the present invention, for example, when the wiring width is 0.8 μm, a wiring layer thickness of 0.3 μm can sufficiently stand practical application. That is, since the wiring layer thickness can be made thinner, unevenness on the semiconductor surface after arrangement of wiring can be suppressed minimum, and also high reliability in passing ordinary current can be obtained. Also, this is possible by a very simple process.

(3) Improvement of surface smoothness (patterning characteristic improvement of wiring)

In the prior art, roughness of the surface of a metal thin film had inconvenience in the alignment step for the mask and the substrate in the patterning step and in the etching step.

That is, there is unevenness extending to several μm on the surface of Al film according to the prior art method, whereby the surface morphology is poor, and therefore had the following disadvantages.

1) Alignment signals cause diffused reflection to occur at the surface, whereby noise level becomes higher and inherent alignment signals cannot be discriminated.

2) For covering large surface unevenness, the resist film thickness must be taken large, which is opposite to fine formation.

3) If the surface morphology is poor, halation due to the resist internal reflection will occur locally, whereby resist remaining occurs.

4) If the surface morphology is poor, the side wall becomes notched in the wiring etching step according to its unevenness.

According to the present invention, the surface morphology of Al film to be formed is markedly improved to cancell all the drawbacks described above.

(4) Improvement of resistance in contact hole and through hole and of contact resistance In the prior art method, if the size of the contact hole becomes finer as 1 μm × 1 μm or less, Si in the wiring is precipitated on the substrate of the contact hole during heat treatment in the wiring step to cover thereover, whereby resistance between the wiring and the element becomes markedly larger.

According to the embodiment of the present invention, since a dense film is formed according to the surface reaction, Al has been confirmed to have a resistivity of 2.7–3.3 μohm cm. Also, the contact resistivity can attain $1 \times 10^{-6}$ ohm.cm² at an area of 0.6 μm × 0.6 μm when the Si portion has an impurity of $10^{20}$ cm$^{-3}$.

That is, according to the present invention, a good contact with the substrate can be obtained.

In other words, in the patterning step, at the line width of the resolving power limit of the exposure machine, the alignment precision $3\sigma = 0.15$ μm can be accomplished, whereby wiring having smooth side plane is rendered possible without causing halation to occur.

(5) It becomes possible to make heat treatment during wiring step lower or abolish the heat treatment step.

As described in detail above, by applying the present invention to the wiring formation method of a semiconductor integrated circuit, the yield can be improved, and reduction of cost can be promoted to great extent as compared with Al wiring of the prior art.

FIGS. 3A–3E show how the Al film according to the present invention is selectively grown.

Figure 3A:
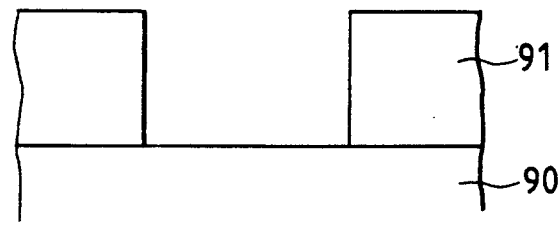
FIGS. 3A–3E are schematic sectional views for illustration of the deposited film forming process according to one embodiment of the present invention.

FIG. 3A is an illustration showing schematically the cross-section of the substrate before formation of the Al deposited film according to the present invention. 90 is the substrate comprising an electron donative material, and 91 a thin film comprising an electron non-donative material.

Figure 3B:
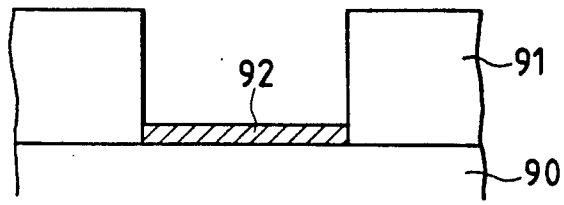

In the case of using DMAH as the starting gas, when a gas mixture containing H₂ as the reaction gas is fed onto the substrate 1 heated within a temperature range from the decomposition temperature of DMAH to 450° C., Al is precipitated on the substrate 90, whereby a continuous film of Al is formed as shown in FIG. 3B. Here, the pressure within the reaction tube 2 should be desirably $10^{-3}$ to 760 Torr, and the DMAH partial pressure preferably $1.5 \times 10^{-5}$ to $1.3 \times 10^{-3}$-fold of the pressure within the above reaction tube.

Figure 3C:
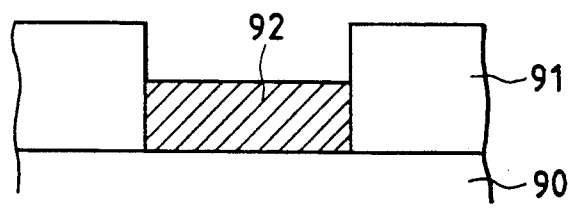
Figure 3D:
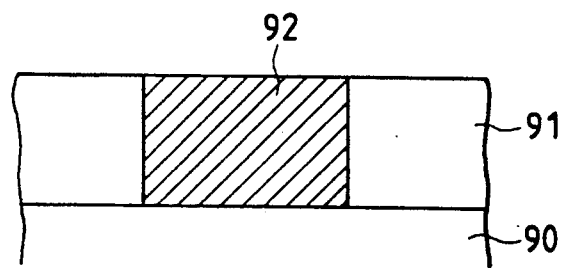
Figure 3E:
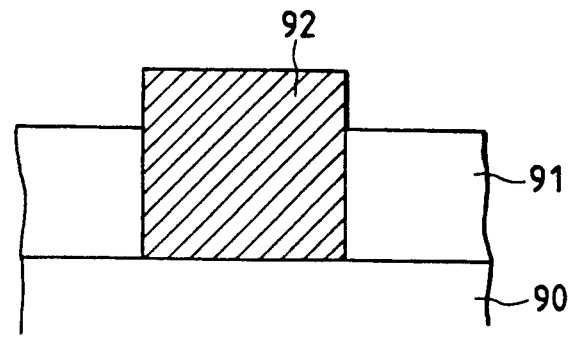

When deposition of Al is continued under the above conditions, via the state of FIG. 3C, the Al film grows to the level of the uppermost portion of the thin film 91 as shown in FIG. 3D. Further, when grown under the same conditions, as shown in FIG. 3E, the Al film can grow to 5000 Å substantially without growth in the lateral direction. This is the most characteristic point of the deposited film obtained by the present invention, and it will be understood how a film of good quality can be formed under good selectivity.

As the result of analysis according to Auger's electron spectroscopy or photoelectric spectroscopy, no entrainment of an impurity such as carbon or oxygen is recognized in this film.

The deposited film thus formed has a resistivity of, for example, with a film thickness of 400 Å, 2.7–3.0 $\mu$ohm.cm at room temperature which is substantially equal to the bulk resistivity of Al, and becomes continuous and flat film. Also, even with a film thickness of 1 $\mu$m, its resistance at room temperature is approximately 2.7–3.0 $\mu$ohm.cm and a sufficiently dense film is formed with a relatively thicker film. The reflectance in the visible wavelength region is approximately 80%, and a thin film with excellent surface flatness can be deposited.

The substrate temperature in performing such selective deposition should be desirably the decomposition temperature of the starting gas containing Al or higher and 450° C. or lower as mentioned above, but specifically a substrate temperature of 200° to 450° C. is desirable, and when deposition is performed under such condition, the deposition speed is sufficiently great as 100 Å/min. to 800 Å/min. when DMAH partial pressure is $10^{-4}$ to $10^{-3}$ Torr. Thus a sufficiently great deposition speed can be obtained as the Al deposition technique for ultra-LSI.

A more preferable substrate temperature condition is 270° C. to 350° C., and the Al film deposited under this condition is also strongly orientatable and, even when subjected to the heat treatment at 450° C. for 1 hour, the Al film on the Si monocrystalline or Si polycrystalline substrate becomes a good Al film without generation of hillock, spike. Also, such Al film is excellent in electro-migration resistance.

Similarly in the case of selective deposition, in the device shown in FIG. 1, Al can be deposited on only one sheet of substrate in deposition for one time. Although a deposition speed of ca. 800 Å/min. can be obtained, it is still insufficient for performing deposition of a large number of sheets within a short time.

As the deposition film forming device for improving this point, there is the low pressure CVD device which can deposit Al by simultaneous mounting of a large number of sheets of wafer. Since the Al film formation according to the present embodiment utilizes the surface reaction of the electron donative substrate surface, in the hot wall type low pressure CVD method wherein only the substrate is heated, Al can be deposited on the substrate by use of DMAH and $H_2$.

The reaction tube pressure may be 0.05 to 760 Torr, desirably 0.1 to 0.8 Torr, the substrate temperature 160° C. to 450° C., desirably 200° C. to 400° C., the DMAH partial pressure $1 \times 10^{-5}$-fold to $1.3 \times 10^{-3}$-fold of the pressure in the reaction tube, and under such conditions, Al can be selectively deposited on only the electron donative substrate.

The deposited film forming device to which such present invention is applicable is the same as in FIG. 2 as described above, and therefore its detailed description is omitted here.

By forming a deposited film under the conditions as described above by use of such device, Al films of good quality can be formed selectively and simultaneously in all the wafers within the device.

As described above, the film obtained according to the Al film selective formation process based on the embodiment of the present invention is dense with very little content of impurity such as carbon, etc. and resistivity which is similar to bulk, and also has high surface smoothness, and therefore remarkable effects as described below can be obtained.

(1) Reduction of hillock

The Al film formed according to the present invention has little internal stress and is under the state of monocrystal or approximate to that. For this reason, in the heat treatment at 450° C. for one hour, as contrasted to formation of $10^4$–$10^6/cm^2$ of hillrocks in the Al film of the prior art, the hillrock number could be greatly improved as 0 to $10/cm^2$.

(2) Improvement of electro-migration resistance

The wiring formed by the method of the prior art has obtained an average wiring life of $1 \times 10^2$ to $10^3$ hours (in the case of a wiring cross-sectional area of 1 $\mu m^2$) under the current passage test conditions of 250° C., $1 \times 10^6$ A/$cm^2$. In contrast, the Al film obtained by the Al film selective formation method based on the embodiment of the present invention could obtain an average wiring life of $10^3$ to $10^4$ hours with a wiring having a cross-sectional area of 1 $\mu m^2$.

(3) Reduction of alloy pit in contact portion

The Al selectively formed according to the present invention can suppress generation of alloy pit at the contact portion with the substrate crystal even by the heat treatment during wiring step, and also a wiring with good contact characteristic can be obtained. That is, even when the junction is made shallow to the extent of 0.1 $\mu$m, the junction will not be destroyed with only the Al material.

(4) Improvement of surface smoothness (patterning characteristic improvement of wiring)

According to the present invention, the surface morphology of the Al film to be formed can be improved epoch-makingly, whereby all of the problems of the prior art can be improved.

That is, in the patterning step, at the line width of the resolving power limit of the exposure machine, the alignment precision $3\sigma = 0.15$ $\mu$m can be accomplished, whereby wiring having smooth side plane is rendered possible without causing halation to occur.

(5) Improvement of resistance in contact hole and through hole and contact resistance According to the present invention, since adense film is selectively formed by the surface reaction even when the opening may be 1 $\mu$m $\times$ 1 $\mu$m or less, it has been confirmed that the Al completely filled within the contact hole and through hole each has a resistivity of 2.7–3.3 $\mu$ohm.cm. Also, the contact resistance can attain $1 \times 10^{-6}$ ohm.$cm^2$ in the case where the Si portion has an impurity of $10^{20} cm^{-3}$ in a hole of 0.6 $\mu$m $\times$ 0.6 $\mu$m.

That is, according to the present invention, the wiring material can be completely embedded only in the minute opening, and also good contact with the substrate can be obtained. Therefore, the present invention can contribute greatly to improvement of resistance within hole and contact resistance which have been the greatest problems in the fine process of 1 μm or less.

(6) It is possible to make the heat treatment temperature during wiring step lower or to omit the heat treatment step.

As described in detail above, by applying the present invention to the wiring formation method of a semiconductor integrated circuit, particularly embedding of contact hole or through hole, the yield can be improved, and reduction of cost can be promoted to great extent as compared with Al wiring of the prior art.

EXAMPLE 1

First, the procedure for Al film formation is as follows. By use of the device shown in FIG. 1, the reaction tube 2 is internally evacuated to ca. $1 \times 10^{-8}$ Torr by the evacuation unit 9. However, Al film can be also formed if the vacuum degree within the reaction tube 2 may be higher than $1 \times 10^{-8}$ Torr.

After washing of Si wafer, the conveying chamber 10 is released to atmospheric pressure and Si wafer is mounted in the conveying chamber. The conveying chamber is evacuated to ca. $1 \times 10^{-6}$ Torr, and then the gate valve 13 is opened and the wafer is mounted on the wafer holder 3.

After mounting of the wafer on the wafer holder 3, the gate valve 13 is closed, and the reaction chamber 2 is evacuated to a vacuum degree of ca. $1 \times 10^{-8}$ Torr.

In this Example, DMAH is fed through the first gas line. As the carrier gas of DMAH line H$_2$ which is the same as the reaction gas is employed. The second gas line is used for H$_2$.

By passing H$_2$ through the second gas line, the pressure within the reaction tube 2 is made a predetermined value by controlling the opening of the slow leak valve 8. A typical pressure in this Example is made approximately 1.5 Torr. Then, the wafer is heated by current passage through the heater 4. After the wafer temperature has reached a predetermined temperature, DMAH is introduced into the reaction tube through the DMAH line. The whole pressure is ca. 1.5 Torr, and the DMAH partial pressure is made ca. $1.5 \times 10^{-4}$ Torr. When DMAH is introduced into the reaction tube 2, Al is deposited. After a predetermined deposition time has elapsed, feeding of DMAH is stopped. Next, heating of the heater 4 is stopped to cool the wafer. Feeding of H$_2$ gas is stopped, and after evacuation internally of the reaction tube, the wafer is transferred to the conveying chamber, and only the conveying chamber is made atmospheric pressure before taking out the wafer. The outline of Al film formation is as described above.

EXPERIMENTAL EXAMPLE 1

Next, preparation of samples according to this Example 1 is described.

130 Sheets of samples of monocrystalline Si substrates (N type, 1-2 ohm.cm) were prepared, the substrate temperatures were set at 13 levels, and Al films were deposited at the respective temperatures each for 10 sheets according to the procedure as described above under the following conditions:

whole pressure: 1.5 Torr
DMAH partial pressure: $1.5 \times 10^{-4}$ Torr.

The Al films deposited by varying the substrate temperature at 13 levels were evaluated by use of various evaluation methods. The results are shown in Table 1.

TABLE 1

| Evaluation item | Substrate temperature (°C.) | | | | | | |
|---|---|---|---|---|---|---|---|
| | 150 | 160 | 200 | 250 | 270 | 300 | 330 |
| Carbon content (%) | — | 0 | 0 | 0 | 0 | 0 | 0 |
| Resistivity (μΩ·cm) | — | 2.7~3.3 | 2.7~3.3 | 2.7~3.3 | 2.7~3.3 | 2.7~3.3 | 2.7~3.3 |
| Reflectance (%) | — | 85~95 | 85~95 | 85~95 | 85~95 | 85~95 | 85~95 |
| Average wiring life (hour) | — | $10^2$~$10^4$ | $10^2$~$10^4$ | $10^2$~$10^4$ | $10^2$~$10^4$ | $10^2$~$10^4$ | $10^2$~$10^4$ |
| Deposition Speed (Å/min) | — | 1~9 | 100~800 | 100~800 | 100~800 | 100~800 | 100~800 |
| Hillock density (cm$^{-2}$) | — | 0~$10^2$ | 0~$10^2$ | 0~$10^2$ | 0~10 | 0~10 | 0~10 |
| Spike generation ratio (%) | — | 0~10 | 0~10 | 0 | 0 | 0 | 0 |

| Evaluation item | Substrate temperature (°C.) | | | | | |
|---|---|---|---|---|---|---|
| | 350 | 370 | 400 | 430 | 450 | 470 |
| Carbon content (%) | 0 | 0 | 0 | 0 | 0 | 1~9 |
| Resistivity (μΩ·cm) | 2.7~3.3 | 2.7~3.3 | 2.7~3.3 | 2.7~3.3 | 2.7~3.3 | 2.7~3.3 |
| Reflectance (%) | 85~95 | 85~95 | 85~95 | 70 | 60 or lower | 60 or lower |
| Average wiring life (hour) | $10^2$~$10^4$ | $10^2$~$10^4$ | $10^2$~$10^4$ | $10^2$~$10^2$ | $10^2$~$10^2$ | $10^2$~$10^2$ |
| Deposition Speed (Å/min) | 100~800 | 100~800 | 100~800 | 100~800 | 100~800 | 1000 |
| Hillock density (cm$^{-2}$) | 0~10 | 0~$10^4$ | 0~$10^4$ | 0~$10^4$ | 0~$10^4$ | 0~$10^4$ |
| Spike | 0 | 0~30 | 0~30 | 0~30 | 0~30 | 0~30 |

TABLE 1-continued generation
ratio (%)

Note:
No deposition occurs at substrate temperature of 150° C.
Average wiring life is time to wire breaking when current is passed at a current density of $1 \times 10^6$ A/cm$^2$ through a cross-sectional area of 1 μm$^2$ at 250° C.
Spike generation ratio is destruction probability at the junction portion of 0.15 μm depth.

Shortly speaking, Al films of very good quality were obtained at a temperature range of 160° C. to 450° C., more preferably 200° C. to 400° C., optimally 270° C. to 350° C.

EXAMPLE 2

First, the procedure of Al film formation is as follows. By the evacuation unit 9, the reaction tube 2 is evacuated internally to ca. $1 \times 10^{-8}$ Torr. Al film can be formed even if the vacuum degree in the reaction tube 2 may be higher than $1 \times 10^{-8}$ Torr.

After washing of the Si wafer, the conveying chamber 10 is released to atmospheric pressure and the Si wafer is mounted in the conveying chamber. The conveying chamber is evacuated to ca. $1 \times 10^{-6}$ Torr, then the gate valve 13 is opened and the wafer is mounted on the wafer holder 3.

After mounting of the wafer holder 3, the gate valve 13 is closed, and the reaction chamber 2 is evacuated to a vacuum degree of ca. $1 \times 10^{-8}$ Torr.

In this Example, the first gas line is used for DMAH. As the carrier gas for the DMAH line, Ar is employed. The second gas line is used for H$_2$.

By passing H$_2$ through the second gas line, the pressure within the reaction tube 2 is made a predetermined value by controlling the opening of the slow leak valve 8. A typical pressure in this Example is made approximately 1.5 Torr. Then, the wafer is heated by current passage through the heater 4. After the wafer temperature has reached a predetermined temperature, DMAH is introduced into the reaction tube through the DMAH line. The whole pressure is ca. 1.5 Torr, and the DMAH partial pressure is made ca. $1.5 \times 10^{-4}$ Torr. When DMAH is introduced into the reaction tube 2, Al is deposited. After a predetermined deposition time has elasped, feeding of DMAH is stopped. Next, heating of the heater 4 is stopped to cool the wafer. Feeding of H$_2$ gas is stopped, and after evacuation internally of the reaction tube, the wafer is transferred to the conveying chamber, and only the conveying chamber is made atmospheric pressure before taking out the wafer. The outline of Al film formation is as described above.

EXPERIMENTAL EXAMPLE 2

Al films were formed according to the method of Example 2. For the films obtained, concerning resistivity, carbon content, average wiring life, deposition speed, hillock density, generation of spike and reflectance, the same results as in Example 1 were obtained.

EXAMPLE 3

This Example 3 performs deposition according to the same procedure by use of MMAH$_2$ as the starting gas by setting the conditions as follows:
whole pressure: 1.5 Torr
MMAH$_2$ partial pressure: $5 \times 10^{-4}$ Torr.

EXPERIMENTAL EXAMPLE 3

According to the method of the above Example 3, films were formed by varying the substrate temperature within a temperature range from 160° C. to 400° C. As the result, Al thin films excellent in flatness, denseness containing no carbon impurity were deposited similarly as in Experimental example 1.

EXAMPLE 4

This Example 4 is film formation according to the low pressure CVD method.

EXPERIMENTAL EXAMPLE 4

A monocrystalline silicon substrate was placed in the low pressure CVD device shown in FIG. 2, and Al film was formed within the same badge. The film formation conditions were made a reaction tube pressure of 0.3 Torr, a DMAH partial pressure of $3.0 \times 10^{-5}$ Torr, a substrate temperature of 300° C., and a film formation time of 10 minutes.

As the result of film formation under such conditions, an Al film of 7000 Å was deposited. The film quality was very good, exhibiting the same properties as one prepared at a substrate temperature of 300° C. shown in Experimental example 1.

EXPERIMENTAL EXAMPLE 5

Samples having Al films formed according to the same method as in Example 1 were prepared. When crystallinity of the Al film deposited on the Si wafer of the respective samples, namely under the same film forming conditions as in Example 1 by use of the X-ray diffraction method and the reflective electron beam diffraction method, it was found to be a monocrystalline Al.

First, the evaluation methods are described.

Figure 4:
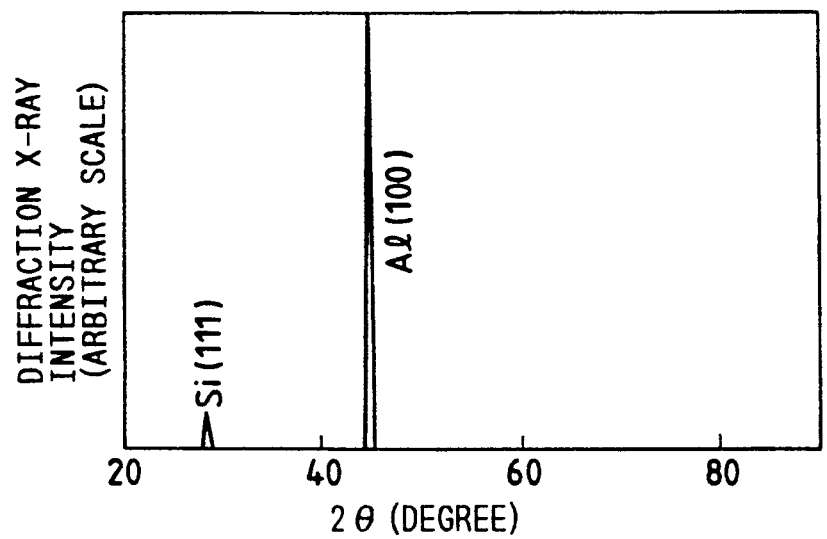
FIG. 4 is a chart showing the X-ray diffraction pattern of the Si (111) substrate having the Al film obtained according to the deposited film forming process of the present invention.
Figure 5A:
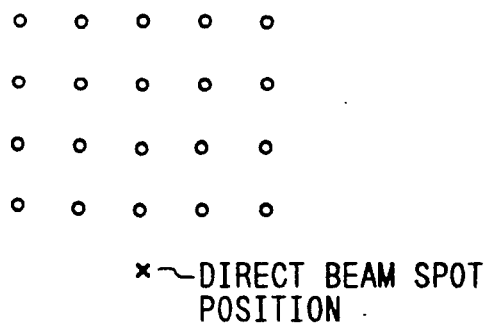
FIGS. 5A and 5B are charts showing the X-ray diffraction pattern of the Al film on the Si (111) substrate obtained according to the deposited film forming process of the present invention.
Figure 5B:
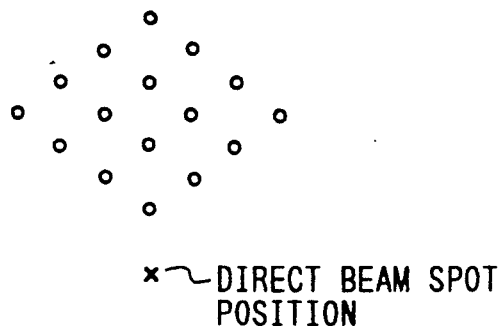

When the crystal direction of the Si substrate is (111) plane, from X-ray diffraction, as shown in FIG. 4, only the diffraction peak showing Al (100) was observed concerning Al. In reflective high speed electron beam diffraction by use of an acceleration voltage of 80 kV or 100 kV, as shown in FIG. 5, a monocrystal spot showing Al (100) was observed. FIG. 5A is a diffraction pattern when electron beam is permitted to enter Al (100) in the [001] direction, FIG. 5B a diffraction pattern when electron beam is permitted to enter Al (100) in the direction of [011]. Thus, the Al film on the Si (111) substrate was found to be a monocrystal having (100) plane. Within the substrate temperature range in Table 1, particularly those deposited at a range from 250° C. to 330° C. were found to have Al films deposited which were stably monocrystalline.

Also, the Al films deposited on the Si (111) substrate with the substrate surface having off-angles differing by 1°, 2°, 3°, 4°, 5° from the Si (111) plane were also found to have Al (100) monocrystals deposited stably, particularly under the temperature conditions of the substrate temperature ranging from 250° C. to 330° C., similarly as in the case when deposited on the Si (111) substrate as described above.

Figure 6:
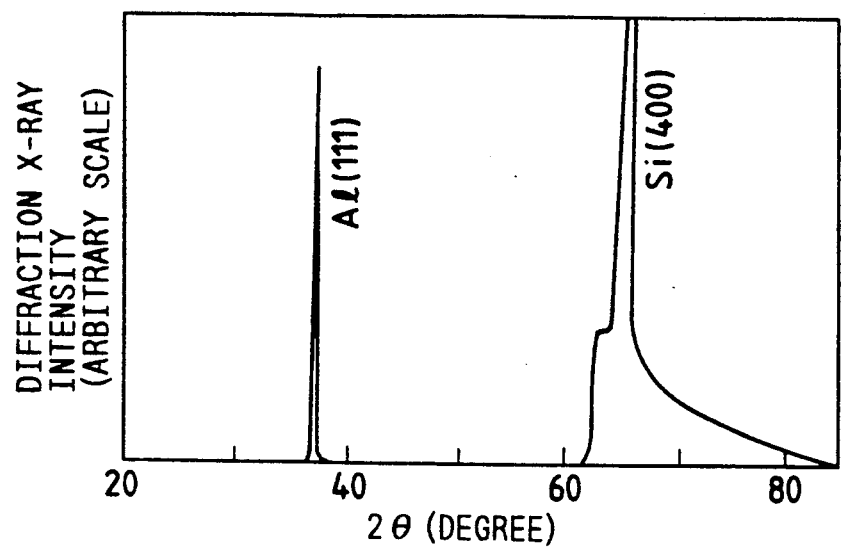
FIG. 6 is a chart showing the X-ray diffraction pattern on the Si (100) substrate having the Al film obtained according to the deposited film forming process of the present invention.

When the crystal direction of the Si substrate is (100) plane, from X-ray diffraction, as shown in FIG. 6, only the diffraction peak showing Al (111) was observed concerning Al. In reflective high speed electron beam diffraction by use of an acceleration voltage of 80 kV or 100 kV, a monocrystal spot showing Al (111) was observed. Thus, the Al film on the Si (100) substrate was found to be a monocrystal having (111) plane. Within the substrate temperature range in Table 1, particularly those deposited at a range from 250° C. to 330° C. were found to have Al films deposited which were stably monocrystalline. Also, the Al films deposited on the Si (100) substrate with the substrate surface having off-angles differing by 1°, 2°, 3°, 4°, 5° from the Si (100) plane were also found to have Al (111) monocrystals deposited stably, particularly under the temperature conditions of the substrate temperature ranging from 250° C. to 330° C., similarly as in the case when deposited on the Si (111) substrate as described above.

EXPERIMENTAL EXAMPLE 6

Crystallinities of the Al films formed according to the method of Example 2 were evaluated. Similarly as in the case of Example 5, particularly within the range of the substrate temperature from 250° C. to 330° C., Al (100) monocrystal was formed on the Si (111) substrate, and Al (111) monocrystal on the Si (100) substrate.

EXPERIMENTAL EXAMPLE 7

Al films were formed on Si substrate according to the method of Example 3. As the result of evaluation of crystallinities of the Al films by the X-ray diffraction method and the reflective high speed electron beam diffraction method, the following results were obtained.

When the crystal direction of the Si substrate surface is (111) plane, from X-ray diffraction, as shown in FIG. 4, only the diffraction peak showing Al (100) was observed concerning Al. In reflective high speed electron beam diffraction by use of an acceleration voltage of 80 kV or 100 kV, as shown in FIG. 5, a monocrystal spot showing Al (100) was observed. Thus, the Al film on the Si (111) substrate was found to be a monocrystal having (100) plane.

Also, the Al films deposited on the Si (111) substrate with the substrate surface having off-angles differing by 1°, 2°, 3°, 4°, 5° from the Si (111) plane were also found to have Al (100) monocrystals deposited, similarly as in the case when deposited on the Si (111) substrate as described above.

When the crystal direction of the Si substrate is (100) plane, from X-ray diffraction, as shown in FIG. 6, only the diffraction peak showing Al (111) was observed concerning Al. In reflective high speed electron beam diffraction by use of an acceleration voltage of 80 kV or 100 kV, a monocrystal spot showing Al (111) was observed. Thus, the Al film on the Si (100) substrate was found to be a monocrystal having (111) plane. Also, the Al films deposited on the Si (100) substrate with the substrate surface having offangles differing by 1°, 2°, 3°, 4°, 5° from the Si (100) plane were also found to have Al (111) monocrystals deposited, similarly as in the case when deposited on the Si (111) substrate as described above.

The Examples 5 to 8 and the Experimental examples 8 to 15 are examples when forming Al films selectively.

EXAMPLE 5

First, the procedure of Al film formation according to this Example is as follows. By use of the device shown in FIG. 1, the reaction tube 2 is internally evacuated to ca. $1 \times 10^{-8}$ Torr by the evacuation unit 9. However, Al film can be also formed even if the vacuum degree within the reaction tube 2 may be higher than $1 \times 10^{-8}$ Torr.

After washing of the Si wafer treated so as to effect selective deposition, the conveying chamber 10 is released to atmospheric pressure and the Si wafer is mounted in the conveying chamber. The conveying chamber is evacuated to ca. $1 \times 10^{-6}$ Torr, then the gate valve 13 is opened and the wafer is mounted on the wafer holder 3.

After mounting of the wafer on the wafer holder 3, the gate valve 13 is closed, and the reaction chamber 2 is evacuated to a vacuum degree of ca. $1 \times 10^{-8}$ Torr.

In this Example, DMAH is fed through the first gas line. As the carrier gas of DMAH line, $H_2$ is employed. The second gas line is used for $H_2$. By passing $H_2$ through the second gas line, the pressure within the reaction tube 2 is made a predetermined value by controlling the opening of the slow leak valve 8. A typical pressure in this Example is made approximately 1.5 Torr. Then, the wafer is heated by current passage through the heater 4. After the wafer temperature has reached a predetermined temperature, DMAH is introduced into the reaction tube through the DMAH line. The whole pressure is ca. 1.5 Torr, and the DMAH partial pressure is made ca. $1.5 \times 10^{-4}$ Torr. When DMAH is introduced into the reaction tube 2, Al is deposited. After a predetermined deposition time has elapsed, feeding of DMAH is stopped. Next, heating of the heater 4 is stopped to cool the wafer. Feeding of $H_2$ gas is stopped, and after evacuation internally of the reaction tube, the wafer is transferred to the conveying chamber, and only the conveying chamber is made atmospheric pressure before taking out the wafer. The outline of Al film formation is as described above.

EXPERIMENTAL EXAMPLE 8

Si substrates (N type, 1-2 ohm.cm) were subjected to thermal oxidation at a temperature of 1000° C. according to the hydrogen combustion system ($H_2$: 4 liters/M, $O_2$: 2 liters/M).

The film thickness was 7000 Å±500 Å, and the reflactive index 1.46. A photoresist was coated on the whole Si substrate, and a desired pattern was baked by an exposure machine. The pattern was such that various holes of 0.25 μm×0.25 μm—100 μm×100 μm were opened. After development of the photoresist, with the photoresist as the mask, the subbing $SiO_2$ was etched by the reactive ion etching (RIE), etc. to have the substrate Si partially exposed. Thus, 130 sheets of samples having various sizes of $SiO_2$ holes of 0.25 μm×0.25 μm—100 μm×100 μm were prepared, the substrate temperature was set at 13 levels, and for the samples each of 10 sheets at the respective temperatures, Al films were selectively deposited following the procedure as described above under the following conditions:

whole pressure: 1.5 Torr
DMAH partial pressure: $1.5 \times 10^{-4}$ Torr.

The Al films deposited by varying the substrate temperature at 13 levels were evaluated by use of various evaluation methods. The results are shown in Table 2.

TABLE 2

| Evaluation item | Substrate temperature (°C.) | | | | | | |
|---|---|---|---|---|---|---|---|
| | 150 | 160 | 200 | 250 | 270 | 300 | 330 |
| Carbon content (%) | — | 0 | 0 | 0 | 0 | 0 | 0 |
| Resistivity ($\mu\Omega \cdot$ cm) | — | 2.7~3.3 | 2.7~3.3 | 2.7~3.3 | 2.7~3.3 | 2.7~3.3 | 2.7~3.3 |
| Reflectance (%) | — | 85~95 | 85~95 | 85~95 | 85~95 | 85~95 | 85~95 |
| Average wiring life (hour) | — | $10^2$~$10^4$ | $10^2$~$10^4$ | $10^2$~$10^4$ | $10^2$~$10^4$ | $10^2$~$10^4$ | $10^2$~$10^4$ |
| Deposition Speed (Å/min) | — | 1~9 | 100~800 | 100~800 | 100~800 | 100~800 | 100~800 |
| Hillock density ($cm^{-2}$) | — | 0~$10^2$ | 0~$10^2$ | 0~$10^2$ | 0~10 | 0~10 | 0~10 |
| Spike generation ratio (%) | — | 0~10 | 0~10 | 0 | 0 | 0 | 0 |

| Evaluation item | Substrate temperature (°C.) | | | | | |
|---|---|---|---|---|---|---|
| | 350 | 370 | 400 | 430 | 450 | 470 |
| Carbon content (%) | 0 | 0 | 0 | 0 | 0 | 1~9 |
| Resistivity ($\mu\Omega \cdot$ cm) | 2.7~3.3 | 2.7~3.3 | 2.7~3.3 | 2.7~3.3 | 2.7~3.3 | 2.7~3.3 |
| Reflectance (%) | 85~95 | 85~95 | 85~95 | 70 | 60 or lower | 60 or lower |
| Average wiring life (hour) | $10^2$~$10^4$ | $10^2$~$10^4$ | $10^2$~$10^4$ | $10^2$~$10^2$ | $10^2$~$10^2$ | $10^2$~$10^2$ |
| Deposition Speed (Å/min) | 100~800 | 100~800 | 100~800 | 100~800 | 100~800 | 1000 |
| Hillock density ($cm^{-2}$) | 0~10 | 0~$10^4$ | 0~$10^4$ | 0~$10^4$ | 0~$10^4$ | 0~$10^4$ |
| Spike generation ratio (%) | 0 | 0~30 | 0~30 | 0~30 | 0~30 | 0~30 |

Note:
No deposition occurs at substrate temperature of 150° C.
Average wiring life is time to wire breaking when current is passed at a current density of $1 \times 10^6$ A/cm$^2$ through a cross-sectional area of 1 $\mu m^2$ at 250° C.
Spike generation ratio is destruction probability at the junction portion of 0.15 $\mu m$ depth.

In the above samples, no Al was deposited on SiO$_2$ at a temperature range from 160° C. to 450° C., and Al was deposited only on the portion with opening of SiO$_2$ to have Si exposed. Also, when deposition was carried out in the above temperature range continuously for 2 hours, similar selective depositability was maintained.

EXAMPLE 6

First, the procedure of Al film formation is as follows. By the evacuation unit 9, the reaction tube 2 is evacuated internally to ca. $1 \times 10^{-8}$ Torr. Al film can be formed even if the vacuum degree in the reaction tube 2 may be higher than $1 \times 10^{-8}$ Torr.

After washing of the Si wafer, the conveying chamber 10 is released to atmospheric pressure and the Si wafer is mounted in the conveying chamber. The conveying chamber is evacuated to ca. $1 \times 10^{-6}$ Torr, then the gate valve 13 is opened and the wafer is mounted on the wafer holder 3.

After mounting of the wafer on the wafer holder 3, the gate valve 13 is closed and the reaction chamber 2 is evacuated to a vacuum degree of ca. $1 \times 10^{-8}$ Torr.

In this Example, the first gas line is used for DMAH. As the carrier gas for the DMAH line, Ar is employed. The second gas line is used for H$_2$.

by passing H$_2$ through the second gas line, the pressure within the reaction tube 2 is made a predetermined value by controlling the opening of the slow leak valve 8. A typical pressure in this Example is made approximately 1.5 Torr. Then, the wafer is heated by current passage through the heater 4. After the wafer temperature has reached a predetermined temperature, DMAH is introduced into the reaction tube through the DMAH line. The whole pressure is ca. 1.5 Torr, and the DMAH partial pressure is made ca. $1.5 \times 10^{-4}$ Torr. When DMAH is introduced into the reaction tube 2, Al is deposited. After a predetermined deposition time has elapsed, feeding of DMAH is stopped. Next, heating of the heater 4 is stopped to cool the wafer. Feeding of H$_2$ gas is stopped, and after evacuation internally of the reaction tube, the wafer is transferred to the conveying chamber, and only the conveying chamber is made atmospheric pressure before taking out the wafer. The outline of Al film formation is as described above.

EXPERIMENTAL EXAMPLE 9

Al films were formed according to the method of Example 6. For the films obtained, concerning resistivity, carbon content, average wiring life, deposition speed, hillock density, generation of spike and reflectance, the same results as in Experimental example 8 were obtained.

Also, selective depositability with substrate was the same as in Experimental example 8.

EXAMPLE 7

This Example is selective deposition of Al according to the low pressure CVD method.

EXPERIMENTAL EXAMPLE 10

By means of the low pressure CVD device shown in FIG. 2, Al films were formed on the substrates with the constitutions as described below (Samples 5-1-5-179).

PREPARATION OF SAMPLE 5-1

On a monocrystalline silicon as the electron donative first substrate surface material, a thermally oxidized $SiO_2$ film as the electron non-donative second substrate surface material was formed, and patterning was effected according to the photolithographic steps as shown in Example 1 to have the monocrystalline surface partially exposed.

The film thickness of the thermally oxidized $SiO_2$ film was found to be 7000 Å, with the size of the exposed portion of the monocrystalline silicon, namely opening being 3 μm × 3 μm. Thus, Sample 5-1 was prepared. (Hereinafter, such sample is expressed as "thermally oxidized $SiO_2$ (hereinafter abbreviated as T-$SiO_2$)-/monocrystalline silicon").

PREPARATION OF SAMPLES 5-2-5-179

Sample 5-2 is an oxidized film formed by normal pressure CVD (hereinafter abbreviated as $SiO_2$)/monocrystalline silicon.

Sample 5-3 is a boron doped oxidized film formed by normal pressure CVD (hereinafter abbreviated as BSG)/monocrystalline silicon.

Sample 5-4 is a phosphorus doped oxidized film formed by normal pressure CVD (hereinafter abbreviated as PSG)/monocrystalline silicon.

Sample 5-5 is a phosphorus and boron doped oxidized film formed by normal pressure CVD (hereinafter abbreviated as BSPG)/monocrystalline silicon.

Sample 5-6 is a nitrided film formed by plasma CVD (hereinafter abbreviated as P-S:N)/monocrystalline silicon.

Sample 5-7 is a thermally nitrided film (hereinafter abbreviated as T-S:N)/monocrystalline silicon.

Sample 5-8 is a nitrided film formed by low pressure CVD (hereinafter abbreviated as LP-S:N)/monocrystalline silicon.

Sample 5-9 is a nitrided film formed by ECR device (hereinafter abbreviated as ECR-SiN)/monocrystalline silicon.

Further, by combinations of the electron donative first substrate surface materials and the electron non-donative second substrate surface materials, Samples 5-11–5-179 shown in Table 3 were prepared. As the first substrate surface material, monocrystalline silicon (monocrystalline Si), polycrystalline silicon (polycrystalline Si), amorphous silicon (amorphous Si), tungsten (W), molybdenum (Mo), tantalum (Ta), tungsten silicide (WSi), titanium silicide (TiSi), aluminum (Al), aluminum silicon (Al-Si), titanium aluminum (Al-Ti), titanium nitride (TiN), copper (Cu), aluminum silicon copper (Al-Si-Cu), aluminum palladium (Al-Pd), titanium (Ti), molybdenum silicide (Mo-Si), tantalum silicide (Ta-Si) were employed. These samples and $Al_2O_3$ substrates, $SiO_2$ glass substrates were placed in the low pressure CVD device shown in FIG. 2, and Al films were formed within the same badge. The film forming conditions were a reaction tube pressure of 0.3 Torr, a DMAH partial pressure of $3.0 \times 10^{-5}$ Torr, a substrate temperature of 300° C. and a film formation time of 10 minutes.

As the result of film formation under such conditions, concerning all the samples applied with patterning from Sample 5-1 to 5-179, deposition of Al film occurred only on the electron donative first substrate surface film to embed completely the opening with the depth of 7000 Å. The film quality of the Al film was found to be very good, exhibiting the same properties as one prepared at a substrate temperature of 300° C. shown in Experimental example 8. On the other hand, on the second substrate surface which is electron non-donative, no Al film was deposited at all, whereby complete selectivity was obtained. On both the $Al_2O_3$ substrate and the $SiO_2$ glass substrate which are electron non-donative, no Al film was deposited at all.

EXPERIMENTAL EXAMPLE 11

By use of the low pressure CVD device shown in FIG. 2, Al film was formed on the substrate with the constitution as described below.

On a thermally oxidized film as the electron non-donative second substrate surface material, a polycrystalline Si as the electron donative first substrate surface material was formed, patterning was effected according to the photolithographic steps as shown in Example 1 to have the thermally oxidized film surface partially exposed. The film thickness of the polycrystalline silicon at this time was 2000 Å, with the size of the thermally oxidized film exposed portion, namely opening being 3 μm × 3 μm. Such sample is called 6-1. By combinations of the electron non-donative second substrate surface materials (T-$SiO_2$, CVD-$SiO_2$, BSG, PSG, BPSG, P-SiN, T-SiN, LP-SiN, ECR-S:N) and the electron-donative first substrate surface materials (polycrystalline Si, amorphous Si, Al, W, Mo, Ta, WSi, TiSi, TaSi, Al-Si, Al-Ti, TiN, Cu, Al-Si-Cu, Al-Pd, Ti, Mo-Si), Samples of 6-1-6-169 shown in Table 3 were prepared. These samples were placed in the low CVD device shown in FIG. 2, and Al film was formed within the same badge. The film forming conditions were a reaction tube pressure of 0.3 Torr, a DMAH partial pressure of $3.0 \times 10^{-5}$ Torr, a substrate temperature of 300° C. and a film forming time of 10 minutes. As the result of film formation under such conditions, in all the samples from 6-1 to 6-169, no Al film was deposited at all at the opening having the electron non-donative second substrate exposed, but Al of about 7000 Å was deposited only on the electron donative first substrate, whereby complete selectivity was obtained. The film quality of the Al film deposited was found to be very good, exhibiting the same properties as one prepared at a substrate temperature of 300° C. in Experimental example 1.

TABLE 3

|  | Monocrystalline Si | Polycrystalline Si | Amorphous Si | W | Mo | Ta | WSi | TiSi | Al | AlSi |
|---|---|---|---|---|---|---|---|---|---|---|
| T-$SiO_2$ | 5-1 | 5-11 | 5-21 | 5-31 | 5-41 | 5-51 | 5-61 | 5-71 | 5-81 | 5-91 |
| $SiO_2$ | 5-2 | 5-12 | 5-22 | 5-32 | 5-42 | 5-52 | 5-62 | 5-72 | 5-82 | 5-92 |

TABLE 3-continued

| | | | | | | | | | | |
|---|---|---|---|---|---|---|---|---|---|---|
| BSG | 5-3 | 5-13 | 5-23 | 5-33 | 5-43 | 5-53 | 5-63 | 5-73 | 5-83 | 5-93 |
| PSG | 5-4 | 5-14 | 5-24 | 5-34 | 5-44 | 5-54 | 5-64 | 5-74 | 5-84 | 5-94 |
| BPSC | 5-5 | 5-15 | 5-25 | 5-35 | 5-45 | 5-55 | 5-65 | 5-75 | 5-85 | 5-95 |
| P-SiN | 5-6 | 5-16 | 5-26 | 5-36 | 5-46 | 5-56 | 5-66 | 5-76 | 5-86 | 5-96 |
| T-SiN | 5-7 | 5-17 | 5-27 | 5-37 | 5-47 | 5-57 | 5-67 | 5-77 | 5-87 | 5-97 |
| LP-SiN | 5-8 | 5-18 | 5-28 | 5-38 | 5-48 | 5-58 | 5-68 | 5-78 | 5-88 | 5-98 |
| ECR-SiN | 5-9 | 5-19 | 5-29 | 5-39 | 5-49 | 5-59 | 5-69 | 5-79 | 5-89 | 5-99 |

| | AlTi | Ti—N | Cu | Al—Si—Cu | AlPd | Ti | Mo—Si | Ta—Si |
|---|---|---|---|---|---|---|---|---|
| T-SiO$_2$ | 5-101 | 5-111 | 5-121 | 5-131 | 5-141 | 5-151 | 5-161 | 5-171 |
| SiO$_2$ | 5-102 | 5-112 | 5-122 | 5-132 | 5-142 | 5-152 | 5-162 | 5-172 |
| BSG | 5-103 | 5-113 | 5-123 | 5-133 | 5-143 | 5-153 | 5-163 | 5-173 |
| PSG | 5-104 | 5-114 | 5-124 | 5-134 | 5-144 | 5-154 | 5-164 | 5-174 |
| BPSG | 5-105 | 5-115 | 5-125 | 5-135 | 5-145 | 5-155 | 5-165 | 5-175 |
| P-SiN | 5-106 | 5-116 | 5-126 | 5-136 | 5-146 | 5-156 | 5-166 | 5-176 |
| T-SiN | 5-107 | 5-117 | 5-127 | 5-137 | 5-147 | 5-157 | 5-167 | 5-177 |
| LP-SiN | 5-108 | 5-118 | 5-128 | 5-138 | 5-148 | 5-158 | 5-168 | 5-178 |
| ECR-SiN | 5-109 | 5-119 | 5-129 | 5-139 | 5-149 | 5-159 | 5-169 | 5-179 |

(note) Numeral shows sample No.

TABLE 4

| | Poly-Crystalline Si | Amorphous Si | W | Mo | Ta | WSi | TiSi | Al | AlSi |
|---|---|---|---|---|---|---|---|---|---|
| T-SiO$_2$ | 6-1 | 6-11 | 6-21 | 6-31 | 6-41 | 6-51 | 6-61 | 6-71 | 6-81 |
| SiO$_2$ | 6-2 | 6-12 | 6-22 | 6-32 | 6-42 | 6-52 | 6-62 | 6-72 | 6-82 |
| BSG | 6-3 | 6-13 | 6-23 | 6-33 | 6-43 | 6-53 | 6-63 | 6-73 | 6-83 |
| PSG | 6-4 | 6-14 | 6-24 | 6-34 | 6-44 | 6-54 | 6-64 | 6-74 | 6-84 |
| BPSC | 6-5 | 6-15 | 6-25 | 6-35 | 6-45 | 6-55 | 6-65 | 6-75 | 6-85 |
| P-SiN | 6-6 | 6-16 | 6-26 | 6-36 | 6-46 | 6-56 | 6-66 | 6-76 | 6-86 |
| T-SiN | 6-7 | 6-17 | 6-27 | 6-37 | 6-47 | 6-57 | 6-67 | 6-77 | 6-87 |
| LP-SiN | 6-8 | 6-18 | 6-28 | 6-38 | 6-48 | 6-58 | 6-68 | 6-78 | 6-88 |
| ECR-SiN | 6-9 | 6-19 | 6-29 | 6-39 | 6-49 | 6-59 | 6-69 | 6-78 | 6-89 |

| | AlTi | Ti—N | Cu | Al—Si—Cu | AlPd | Ti | Mo—Si | Ta—Si |
|---|---|---|---|---|---|---|---|---|
| T-SiO$_2$ | 6-91 | 6-101 | 6-111 | 6-121 | 6-131 | 6-141 | 6-151 | 6-161 |
| SiO$_2$ | 6-92 | 6-102 | 6-112 | 6-122 | 6-132 | 6-142 | 6-152 | 6-162 |
| BSG | 6-93 | 6-103 | 6-113 | 6-123 | 6-133 | 6-143 | 6-153 | 6-163 |
| PSG | 6-94 | 6-104 | 6-114 | 6-124 | 6-134 | 6-144 | 6-154 | 6-164 |
| BPSG | 6-95 | 6-105 | 6-115 | 6-125 | 6-135 | 6-145 | 6-155 | 6-165 |
| P-SiN | 6-96 | 6-106 | 6-116 | 6-126 | 6-136 | 6-146 | 6-156 | 6-166 |
| T-SiN | 6-97 | 6-107 | 6-117 | 6-127 | 6-137 | 6-147 | 6-157 | 6-167 |
| LP-SiN | 6-98 | 6-108 | 6-118 | 6-128 | 6-138 | 6-148 | 6-158 | 6-168 |
| ECR-SiN | 6-99 | 6-109 | 6-119 | 6-129 | 6-139 | 6-149 | 6-159 | 6-169 |

(note) Numeral shows sample No.

EXAMPLE 8

This Example is the method of depositing selectively Al by use of MMAH$_2$.

EXPERIMENTAL EXAMPLE 12

When deposition was carried out according to the same procedure as shown in Example 1 by use of MMAH$_2$ as the starting gas and setting the conditions as follows:

whole pressure: 1.5 Torr

MMAH$_2$ partial pressure: $5 \times 10^{-4}$ Torr, in the temperature range of the substrate temperature from 160° C. to 400° C., an Al thin film containing no carbon impurity and having excellent flatness, denseness and selectivity with the substrate surface materials was deposited similarly as in Example 1.

EXPERIMENTAL EXAMPLE 13

According to the same method as in Example 5, a sample having an Al film formed thereon was prepared. The crystallinity of the Al film selectively deposited on Si at the same substrate temperature as in Table 1 was evaluated by the X-ray diffraction method and the scanning μ-RHEED microscope.

Figure 7:
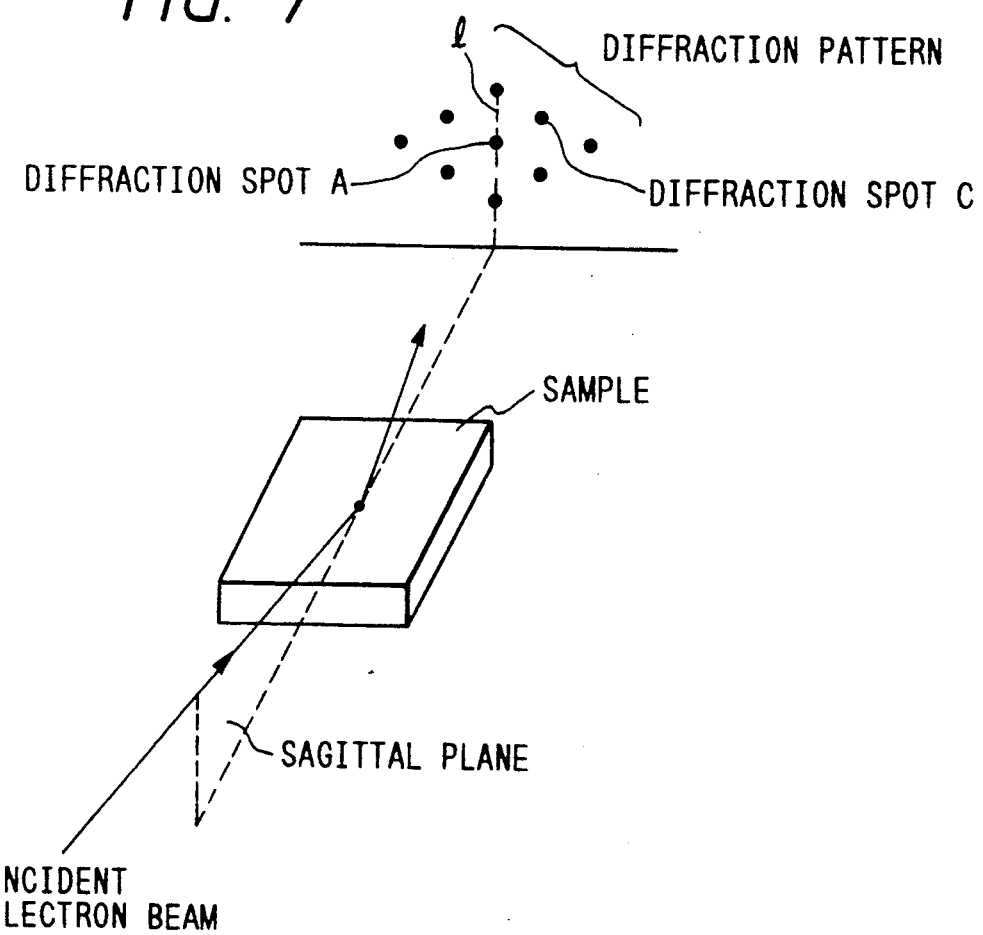
FIG. 7 is a schematic view for illustration of the scanning $\mu$-RHEED method.
Figure 8:
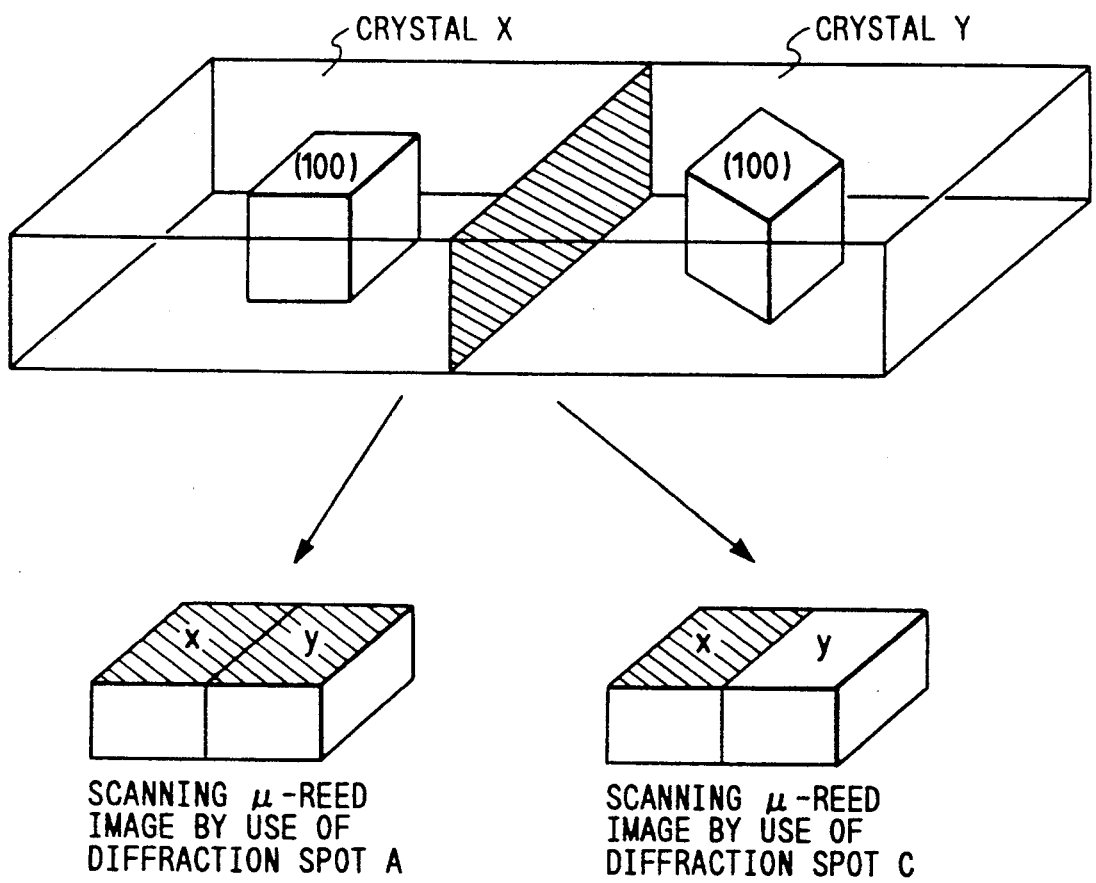
FIG. 8 is a schematic view for illustration of the scanning $\mu$-RHEED method.

The scanning μ-RHEED microscope is the method disclosed in Extended Abstracts of the 21th Conference on Solid State Devices and Materials (1989) p.217 and Japanese Journal of Applied Physics vol. 28, No. 11 (1989), L2075. According to the RHEED (Reflection High Energy Electron Diffraction) method of prior art, electron beam was permitted to be incident on the sample surface at a shallow angle of 2°-3°, and the crystallinity of the sample surface was evaluated from the diffraction pattern formed by the diffracted electron beam. However, since the electron beam diameter is large as 100 μm to several hundred μm, only average information on the sample surface could be obtained. In the μ-RHEED microscope, an electron beam diffraction pattern from a specific fine region on the sample surface can be observed by narrowing the electron beam diameter of 0.1 μm. Also, by scanning the electron beam two-dimensionally on the sample surface, by use of any desired diffraction spot intensity change on the diffraction pattern as the image signal, two dimensional image (scanning μ-RHEED image) on the sample surface can be obtained. At this time by observation of the scanning μ-RHEED image by use of different diffraction spots A and C on the diffraction pattern as shown in FIG. 7, even if the lattice planes in parallel to the sample surface may be aligned in (100), the crystal grain boundaries rotating within the plane can be visualized as distinguished from each other. Here, the diffraction spot A is a diffraction spot on the line (line 1) where the plane in which the diffraction pattern occurs and the sagittal plane formed by the incident electron beam are crossed at right angle, while the diffraction spot C is a diffraction spot not on the line 1. As shown in FIG. 8, when the lattice plane in parallel to the sample surface is, for example, (100), but crystal grains x and y are rotating mutually within the plane, in the scanning μ-RHEED image by use of the diffraction spot A, both crystal grains x and y are displayed as the region with strong intensity. On the other hand, in the scanning μ-RHEED image by use of the diffraction spot C, only the crystal grain x is displayed as the region with strong intensity. Therefore, by observation of the scanning μ-RHEED image by use of the diffraction spots A and C as shown in FIG. 7, it can be discriminated whether the crystal in the region observed is a polycrystal including interplanar rotation or a monocrystal. In Extended Abstracts of the 21th Conference on Solid State Devices and Materials (1989) p.217 and Japanese Journal of Applied Physics vol. 28, No. 11 (1989) L2075, concerning Cu thin film, it has been clarified that, for example, even if the lattice plane in parallel to the sample surface may be {100}, there exists a crystal grain including interplanar rotation in the {100} crystal grains.

First, the Al film deposited selectively on the Si exposed surface at the substrate temperature in Table 1 was evaluated.

Figure 9:
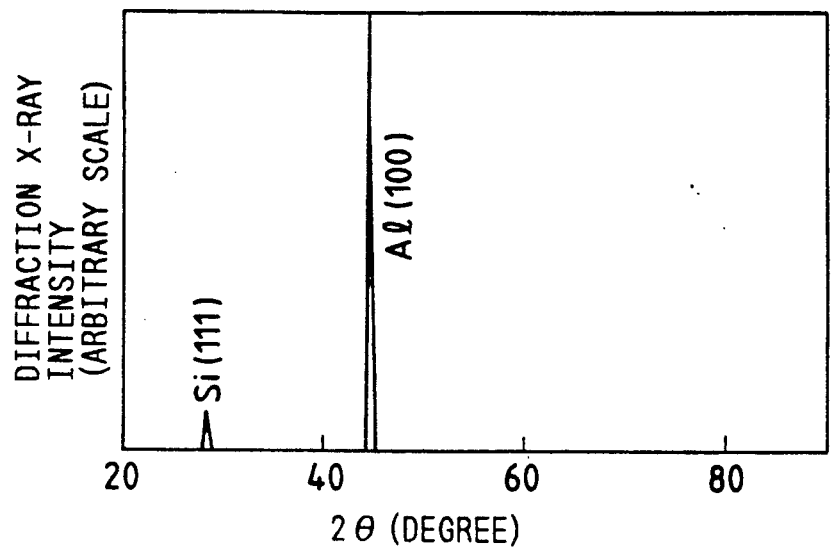
FIG. 9 is a chart showing another example of the X-ray diffraction pattern of the substrate having the Al film obtained according to the selective deposited film forming process of the present invention.
Figure 10A:
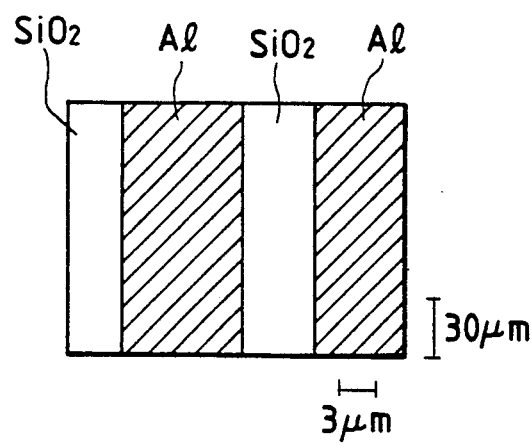
FIGS. 10A–10C are schematic views showing an example of the scanning secondary electron image and the scanning $\mu$-RHEED image of the substrate having the Al film obtained according to the selective deposited film forming process of the present invention.
Figure 10B:
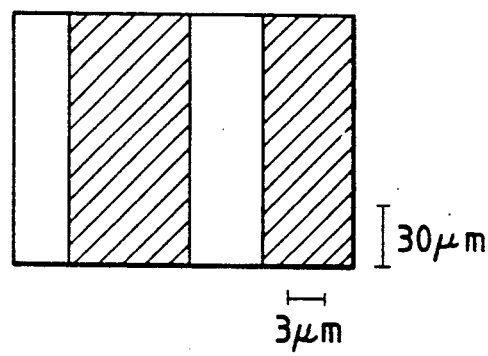
Figure 10C:
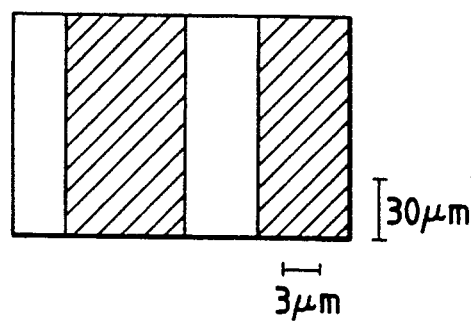

When the crystal direction on the Si substrate surface is (111) plane, from X-ray diffraction, concerning Al, as shown in FIG. 9, only the diffraction peak showing Al (100) could be observed. Next, crystallinity of the Al film deposited selectively was evaluated by use of a scanning μ-RHEED microscope. As shown in FIG. 10, after the region where Al had been selectively deposited was specified by the scanning secondary electron image showing the surface form (FIG. 10A), by use of the diffraction spot 200 (corresponding to the diffraction spot A in FIG. 7) and the diffraction spot 620 (corresponding to the diffraction spot C in FIG. 7) on the diffraction pattern occurring when the electron beam was permitted on the Al (100) plane from the [001] direction, the scanning μ-RHEED image (FIG. 10B) and FIG. 10C) was observed. As shown schematically in FIG. 10B and FIG. 10C, there is no change in lightness and darkness on the Al film selectively deposited, and the Al selectively deposited was confirmed to be an Al (100) monocrystal.

On the other hand, when the Si exposed plane is not linear but like via-hole, irrespectively of the via-hole diameter, the Al selectively deposited was found to be similarly Al (100) monocrystal. Those at substrate temperatures ranging from 250° C. to 330° C. were selectively deposited stably, and the Al obtained was found to become monocrystal.

Also, Al films deposited selectively on the Si (111) substrate with the Si (111) plane being at off-angles by 1°, 2°, 3°, 4°, 5° from the Si substrate were also found to deposit Al (100) monocrystals under the temperature conditions of the substrate temperature ranging from 250° C. to 330° C. similarly as deposited on the Si (111) substrate as described above.

Figure 11:
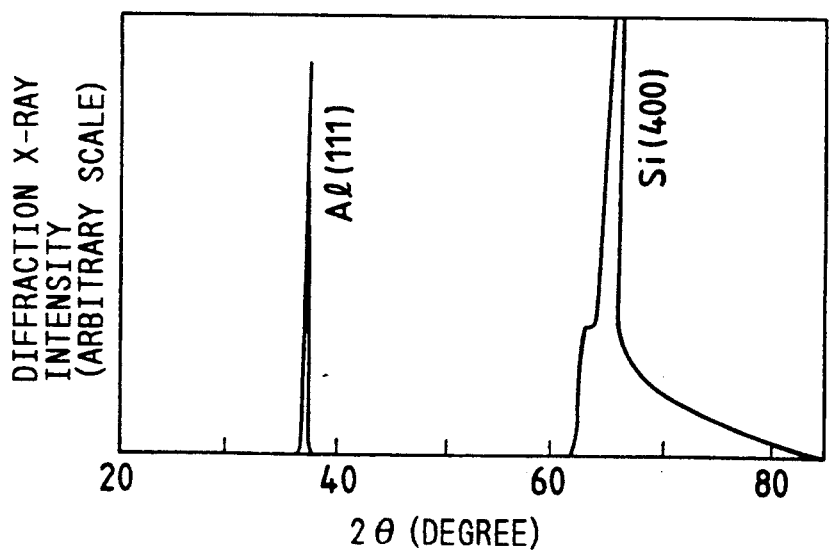
FIG. 11 is a chart showing another example of the X-ray diffraction pattern of the substrate having the Al film obtained by the selective deposited film forming process of the present invention.
Figure 12A:
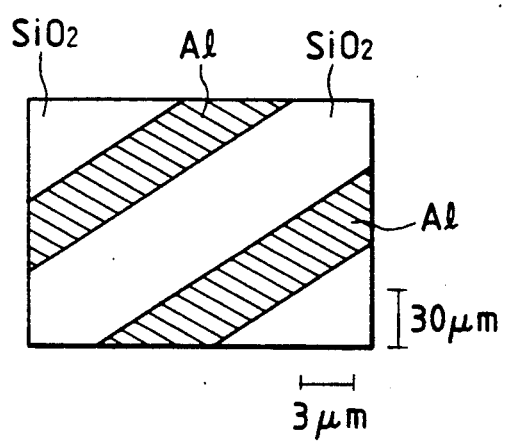
FIGS. 12A–12C are schematic views of another example of the scanning secondary electron image and the scanning $\mu$-RHEED image of the substrate having the Al film obtained according to the selective deposited film forming process of the present invention.
Figure 12B:
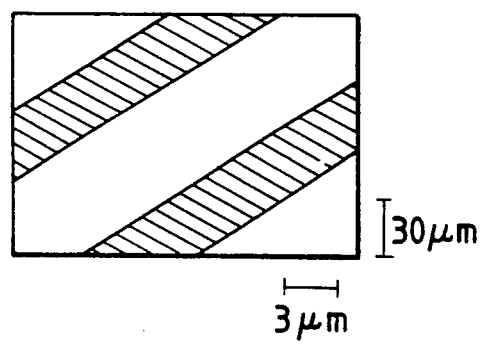
Figure 12C:
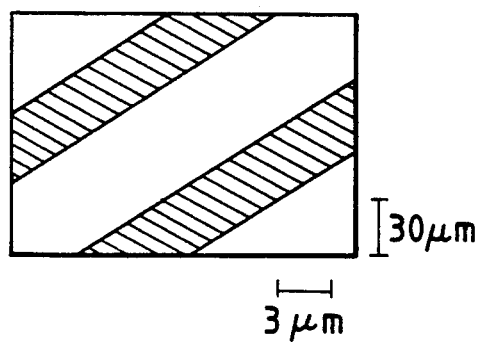

When the crystal direction of the Si substrate surface is the (100) plane, from X-ray diffraction, concerning Al, as shown in FIG. 11, only the diffraction peak showing Al (111) could be observed. FIG. 12 shows the scanning secondary electron image (FIG. 12A) and the scanning μ-RHEED image (FIGS. 12B and 12C) when Al was selectively deposited on only the Si exposed surface on a substrate having Si (100) exposed in a line by patterning of SiO₂ in a line. For the scanning μ-RHEED image, the 333 diffraction spots (FIG. 12B) and 531 diffraction spots (FIG. 12C) were employed. The Al film selectively deposited was confirmed to be an Al (111) monocrystal. Those at substrate temperatures ranging from 250° C. to 330° C. were found to be selectively deposited stably, and the Al films obtained became monocrystals.

Also, Al films deposited selectively on the Si (100) substrate with the Si (100) plane being at off-angles by 1°, 2°, 3°, 4°, 5° from the Si substrate surface were also found to deposit Al (111) monocrystals under the temperature conditions of the substrate temperature ranging from 250° C. to 330° C. similarly as deposited on the Si (111) substrate as described above.

EXPERIMENTAL EXAMPLE 14

Crystallinity of the Al film deposited selectively according to the same method as shown in Example 6 was evaluated. Similarly as in Experimental example 8, at substrate temperatures ranging from 250° C. to 330° C., Al (100) monocrystals on the Si (111) substrate and Al (111) monocrystals on Si (100) substrate were obtained stably.

EXPERIMENTAL EXAMPLE 15

Crystallinity of the Al film deposited selectively according to the same method as shown in Example 7 was evaluated.

From the scanning μ-RHEED microscope observation according to the same observation method as described in Experimental example 13, when the first substrate material is Si (111), in either case when the second substrate material is T-SiO₂, SiO₂, BSG, PSG, BPSG, P-SiN, T-Si-N, LP-SiN or ECR-SiN, the Al selectively deposited on Si was found to be Al (100). When the first substrate material is Si (100), in either case when the substrate material is T-SiO₂, SiO₂, BSG, PSG, BPSG, P-SiN, T-SiN, LP-SiN or ECR-SiN, the Al film selectively deposited was found to be Al (111).

When the first material is TiN, in either case when the second substrate material is T-SiO₂, SiO₂, BSG, PSG, BPSG, P-SiN, T-SiN, LP-SiN or ECR-SiN, the Al film selectively deposited on TiN was found to be oriented in Al (111) from X-ray diffraction, and from reflective high speed electron beam diffraction pattern of the prior art by use of an electron beam of an acceleration voltage of 80 kV or 100 kV, diffraction spots concerned with Al (111) were strongly observed.

COMPARATIVE EXPERIMENT

An Al film was formed on a monocrystalline silicon under the following conditions.

By passing Ar in place of H₂, Al was deposited by pyrolysis of DMAH. The total pressure at this time was made 1.5 Torr, the DMAH partial pressure $1.5 \times 10^{-4}$ Torr, and the substrate temperature of 270°-350° C.

When the Al film thus formed was evaluated, about 2% of carbon was found to be contained at the minimum.

Resistivity became greater by 2-fold or more than the case when hydrogen was employed.

As to reflectance, it was lowered to about ½ to 1/9 relative the case when hydrogen was employed.

Similarly, wiring life was shorter by 1 to 2 cipher, generation probability of hillock became greater by 2 cipher or more, and a large number of spikes were found to be generated.

As to the deposition speed, it was lowered to ½ to ¼.

As described above, Al deposited only by decomposition of DMAH without use of $H_2$ is inferior in film quality, and was unsatisfactory as the Al film for a semiconductor device.

Separately, without use of $H_2$, DMAH was decomposed by the optical CVD method to deposit Al. As the result, same improvement such as no containment of carbon, and the like was observed from the Al film prepared as compared with the case when no light was employed, but other characteristics were not improved so much, and the Al film was still unsatisfactory as the Al film for a semiconductor device.

As described above, the mechanism of Al deposition according to the present invention may be presently hypothesized as follows.

Figure 13A:
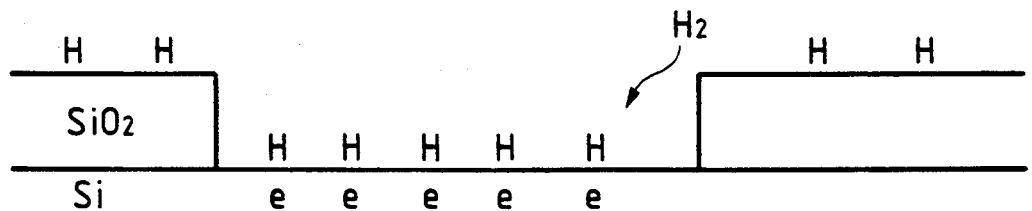
FIGS. 13A–13D are illustrations for explaining the mechanism of Al deposition according to the present invention.
Figure 13B:
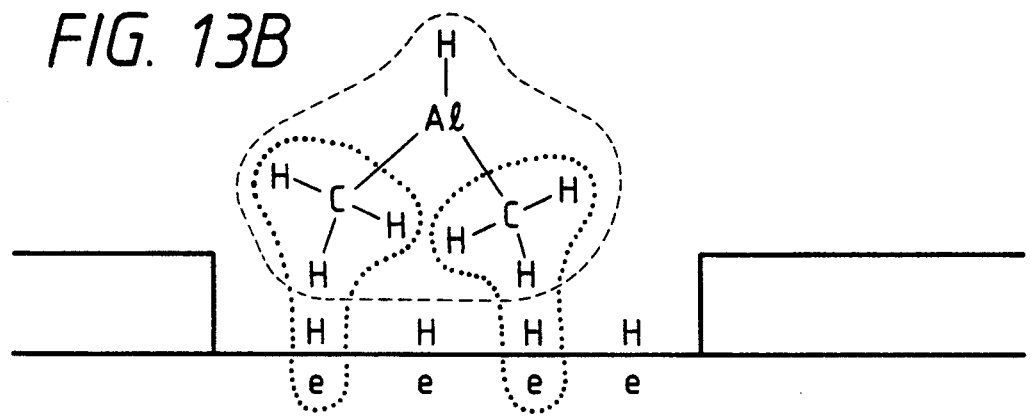
Figure 13C:
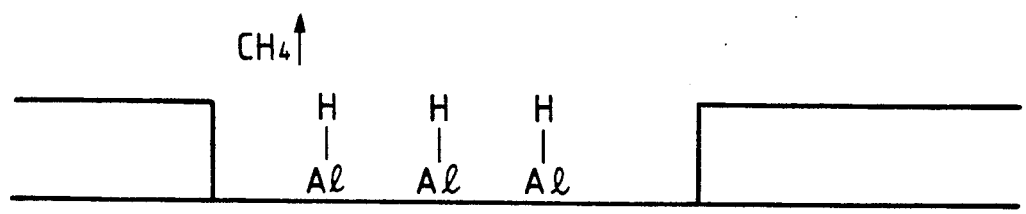

When DMAH reaches the electron donative substrate, namely the substrate having electrons under the state on which hydrogen atoms are attached (FIG. 13A) with the methyl groups directed toward the substrate side, one electron of the substrate cut one bond of Al and methyl group (FIGS. 13B, 13C).

The reaction scheme at this time is as follows:

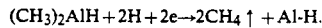
$(CH_3)_2AlH + 2H + 2e \rightarrow 2CH_4 \uparrow + Al-H$.

Figure 13D:
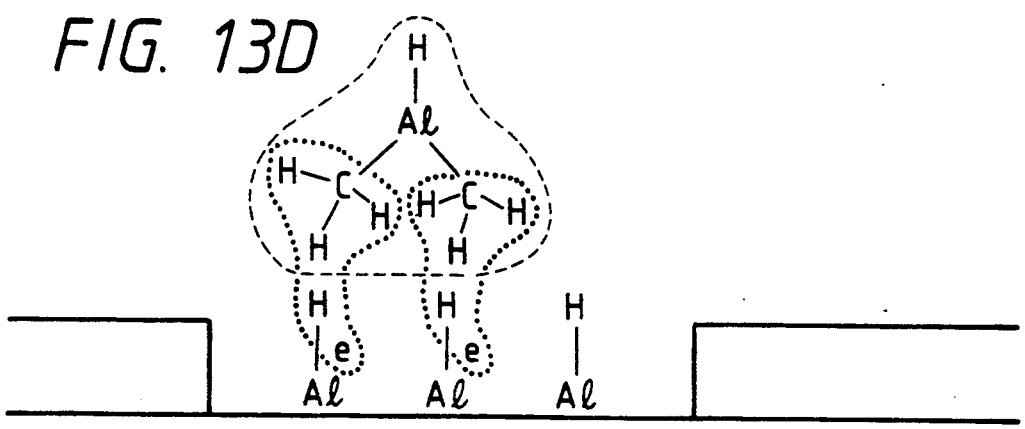

Further, similar reactions will proceed for the hydrogen atoms remaining on deposited Al having free electrons (FIG. 13D). Here, when hydrogen atoms are deficient, hydrogen molecules constituting the reaction gas are decomposed on the substrate to suppy hydrogen atoms. On the other hand, since there is no electron on the electron non-donative surface, the above-mentioned reaction will not proceed and no Al deposited.

FIGS. 13A–13D are illustrations for better understanding of the reacion mechanism, and the numbers of H, e and Al shown in FIGS. 13A–13D are not necessarily coincident.

As described above, according to the present invention, a low resistivity, dense and flat Al film could be deposited on a substrate.

Also, depending on the kind of the substrate, deposition can be effected selectively.

What we claim is:

1. A process for forming a deposited film comprising the steps of:
   (a) providing a substrate having an electron donative surface (A) in a space for formation of the deposited film,
   (b) introducing a gas of the an alkyl aluminum hydride and hydrogen gas into said space for formation of deposited film, and
   (c) maintaining the temperature of said electron donative surface (A) within the range of from the decomposition temperature of said alkyl aluminum hydride to 450° C. to form an aluminum film on said electron donative surface (A).

2. The process according to claim 1, wherein said alkyl aluminum hydride is dimethyl aluminum hydride.

3. The process according to claim 1, wherein said alkyl aluminum hydride is monomethyl aluminum hydride.

4. The process according to claim 1, wherein said substrate is formed of a material selected from monocrystalline silicon, polycrystalline silicon and amorphous silicon.

5. The process according to claim 1, wherein said substrate is a III–V compound semiconductor containing an element belonging to the group III of the periodic table and an element belonging to the group V of the periodic table.

6. The process according to claim 1, wherein said substrate is a II–VI compound semiconductor containing an element belonging to the group II of the periodic table and an element belonging to the group VI of the periodic table.

7. The process according to claim 1, wherein said substrate is a metal containing at least one element selected from tungsten, molybdenum, tantalum, aluminum, titanium and copper.

8. The process according to claim 1, wherein said substrate is a metal.

9. The process according to claim 1, wherein said substrate is a semiconductor.

10. The process according to claim 1, wherein said substrate is silicide.

11. The process according to claim 1, wherein said aluminum film is monocrystalline.

12. A process for forming a deposited film comprising the steps of:
    (a) providing a substrate having an electron donative surface (A) and an electron non-donative surface (B) in a space for formation of the deposited film,
    (b) introducing a gas of an alkyl aluminum hydride and hydrogen gas into said space for formation of the deposited film, and
    (c) maintaining the temperature of said electron donative surface (A) within the range of from the decomposition temperature of said alkyl aluminum hydride to 450° C. to form an aluminum film selectively on said electron donative surface (A).

13. The process according to claim 12, wherein said alkyl aluminum hydride is dimethyl aluminum hydride.

14. The process according to claim 12, wherein said alkyl aluminum hydride is monomethyl aluminum hydride.

15. The process according to claim 12, wherein said electron donative surface (A) is formed of a material selected from monocrystalline silicon, polycrystalline silicon and amorphous silicon, and said electron non-donative surface (B) is formed of an insulating material.

16. The process according to claim 12, wherein said electron donative surface (A) is formed of a III–V group compound semiconductor containing an element belonging to the group III of the periodic table and an element belonging to the group V of the periodic table, and said electron non-donative surface (B) is formed of an insulating material.

17. The process according to claim 12, wherein said electron donative surface (A) is formed of a II–VI group compound semiconductor containing an element belonging to the group II of the periodic table and an element belonging to the group VI of the periodic table, and said electron non-donative surface (B) is formed of an insulating material.

18. The process according to claim 12, wherein said electron donative surface (A) is formed of a metal containing at least one element selected from tungsten, molybdenum, tantalum, aluminum, titanium and copper, and said electron non-donative surface (B) is formed of an insulating material.

19. The process according to claim 12, wherein said electron donative surface (A) is formed of a metal and said electron non-donative surface (B) is formed of an insulating material.

20. The process according to claim 12, wherein said electron donative surface (A) is formed of a semiconductor and said electron non-donative surface (B) is formed of an insulating material.

21. The process according to claim 12, wherein said electron donative surface (A) is formed of silicide and said electron non-donative surface (B) is formed of an insulating material.

* * * * *

UNITED STATES PATENT AND TRADEMARK OFFICE
CERTIFICATE OF CORRECTION

PATENT NO. : 5,179,042
DATED : January 12, 1993
INVENTOR(S) : NOBUO MIKOSHIBA, ET AL.

It is certified that error appears in the above-identified patent and that said Letters Patent is hereby corrected as shown below:

On the title page:
IN [56] REFERENCES CITED

Under FOREIGN PATENT DOCUMENTS, "2053242  6/1971" should read --2053242  5/1971--.

COLUMN 1

Line 46, "or" should read --of--.

COLUMN 5

Line 21, "a" should read --an--.

COLUMN 12

Line 22, "cancell" should read --cancel--.

COLUMN 13

Line 45, "hillock, spike." should read --hillock or spike.--.

COLUMN 14

Line 21, "hillrocks" should read --hillocks--.
   Line 22, "hillrock" should read --hillock--.
   Line 56, "adense" should read --a dense--.

COLUMN 17

Line 44, "elasped," should read --elapsed,--.

UNITED STATES PATENT AND TRADEMARK OFFICE
CERTIFICATE OF CORRECTION

PATENT NO. : 5,179,042
DATED : January 12, 1993
INVENTOR(S) : NOBUO MIKOSHIBA, ET AL.

It is certified that error appears in the above-identified patent and that said Letters Patent is hereby corrected as shown below:

COLUMN 20

Lines 48-49, "reflactive" should read --refractive--.

COLUMN 21

Line 66, "by" should read --By--.

COLUMN 25

TABLE 3-continued, ""BPSC" should read --BPSG--.
TABLE 4, "BPSC" should read --BPSG--.
TABLE 4, "6-78        should read      --6-78
          6-78"                          6-79--.

COLUMN 26

Line 48, "21th" should read --21st--.

COLUMN 27

Line 25, "21th" should read --21st--.
Line 50, "10B)" should read --10B--.

COLUMN 28

Line 45, "T-Si-N," should read --T-SiN,--.

UNITED STATES PATENT AND TRADEMARK OFFICE
CERTIFICATE OF CORRECTION

PATENT NO. : 5,179,042

DATED : January 12, 1993

INVENTOR(S) : NOBUO MIKOSHIBA, ET AL.

Page 3 of 3

It is certified that error appears in the above-identified patent and that said Letters Patent is hereby corrected as shown below:

COLUMN 29

Line 42, "suppy" should read --supply--.
    Line 47, "reacion" should read --reaction--.
    Line 61, "the" should be deleted.
    Line 63, "deposited" should read --the deposited--.

Signed and Sealed this

Twenty-fifth Day of January, 1994

Attest:

BRUCE LEHMAN

Attesting Officer

Commissioner of Patents and Trademarks